(12) United States Patent  
Ushida et al.

(10) Patent No.: US 7,166,392 B2  
(45) Date of Patent: Jan. 23, 2007

(54) HALFTONE TYPE PHASE SHIFT MASK BLANK AND HALFTONE TYPE PHASE SHIFT MASK

(75) Inventors: Masao Ushida, Yamanashi (JP); Minoru Sakamoto, Yamanashi (JP); Naoki Nishida, Tokyo (JP)

(73) Assignee: Hoya Corporation, Tokyo (JP)

( * ) Notice: Subject to any disclaimer, the term of this patent is extended or adjusted under 35 U.S.C. 154(b) by 177 days.

(21) Appl. No.: 10/375,063

(22) Filed: Feb. 28, 2003

(65) Prior Publication Data

US 2003/0219654 A1   Nov. 27, 2003

(30) Foreign Application Priority Data

| Mar. 1, 2002 | (JP) | ............................. P. 2002-056133 |
| Oct. 24, 2002 | (JP) | ............................. 2002-006747 U |
| Oct. 24, 2002 | (JP) | ............................. P. 2002-310149 |
| Feb. 14, 2003 | (JP) | ............................. P. 2003-036825 |

(51) Int. Cl.  
*G03F 1/00*   (2006.01)

(52) U.S. Cl. ............................................... 430/5

(58) Field of Classification Search .................. 430/5, 430/22, 30; 382/144  
See application file for complete search history.

(56) References Cited

U.S. PATENT DOCUMENTS

| 5,882,827 A | * | 3/1999 | Nakao ............................. 430/5 |
| 6,087,047 A | * | 7/2000 | Mitsui et al. ................... 430/5 |

FOREIGN PATENT DOCUMENTS

| JP | 4-136854 | 5/1992 |
| JP | 6/282063 | 10/1994 |
| JP | 7-128840 | 5/1995 |
| JP | 2983020 | 9/1999 |

\* cited by examiner

*Primary Examiner*—S. Rosasco  
(74) *Attorney, Agent, or Firm*—Sughrue Mion, PLLC

(57) ABSTRACT

A halftone type phase shift mask having a semitranslucent film pattern and a shielding film pattern provided on a transparent substrate in this order is constituted in such a manner that each of the reflectances of the transparent substrate, the semitranslucent film pattern and the shielding film pattern for an inspecting light represents a difference which can detect the semitranslucent film pattern and the shielding film pattern based on a reflected light generated when the inspecting light is irradiated on the mask.

34 Claims, 6 Drawing Sheets

HALFTONE TYPE PHASE SHIFT MASK BLANK AND HALFTONE TYPE PHASE SHIFT MASK

BACKGROUND OF THE INVENTION

1. Field of the Invention

The present invention relates to a halftone type phase shift mask blank and a halftone type phase shift mask, and more particularly to a halftone type phase shift mask blank and a halftone type phase shift mask which can be inspected with high precision.

2. Description of the Related Art

Examples of a phase shift mask include a so-called halftone type phase shift mask described in JP-A-4-136854. The halftone type phase shift mask has such a feature that the function of shifting the phase of an exposed light and the function of substantially intercepting the exposed light are shared in a semitranslucent film pattern, resulting in a simple structure. However, in the case in which the halftone type phase shift mask of this kind is repetitively used as a mask (a reticle) of a reducing exposure projector (a stepper), an equivalent phenomenon to a substantial light exposure is generated in a region which should not be exposed originally due to a shift of the light transmitting region of a covering member (an aperture) and the transfer region of the reticle. Consequently, there is a problem in that a pattern defect and other drawbacks are apt to be caused.

Techniques for solving the problem have already been filed by the present applicant (see JP-A-6-282063). A halftone type phase shift mask according to these techniques further comprises a shielding film pattern (a shielding band) containing chromium as a principal component in the outer peripheral portion of a transfer region in addition to a phase shift film (a semitranslucent film) pattern, and produces an advantage that a region which should not be exposed can be reliably shielded by the shielding film pattern also in case of repetitive use as the reticle of a stepper.

As described in JP-A-7-128840, for example, there has also been proposed a halftone type phase shift mask in which a shielding film pattern is formed in a region which does not contribute to the phase shift effect of a semitranslucent film pattern in a transfer region in order to prevent a bad influence based on the light transmitting property of the semitranslucent film pattern also in the transfer region.

In the halftone type phase shift mask, furthermore, there has been known that an unnecessary light intensity peak (side lobe light) appears in the semitranslucent film pattern. In recent years, particularly, the transmittance of the semitranslucent film tends to be increased from the vicinity of 6% which is a conventional mainstream to the vicinity of 9%, and furthermore, to the vicinity of 15%. In that case, the light intensity of the side lobe light is increased so that an influence thereof cannot be disregarded. Under the present circumstances, therefore, there has been increased the necessity of a halftone type phase shift mask having a structure in which at least a phase shift effect over a semitranslucent film pattern in a transfer region is not influenced and a shielding film pattern is formed in a position in which the light intensity of the side lobe light is reduced.

Further, when a pattern transfer is to be carried out by using the halftone type phase shift mask, furthermore, precision in the transfer of a pattern is deteriorated by the generation of a stray light if an exposed light is reflected over the surface of a shielding film pattern. Therefore, there has also been known a halftone type phase shift mask in which a reflection preventing film formed by a material such as CrON, CrO or CrF is provided on the surface of a shielding film (the shielding film pattern) in order to prevent the generation of the stray light such as described in Japanese Patent No. 2,983,020 gazette (page 6, FIG. 1)).

For an exposed light to be utilized in the use of the phase shift mask, an i-ray (a wavelength of 365 nm) or a KrF excimer laser (a wavelength of 248 nm) is a current mainstream and a change into an ArF excimer laser (a wavelength of 193 nm) or an F2 excimer laser (a wavelength of 157 nm) which has a shorter wavelength has been carried out.

Thus, the microfabrication of a pattern can be carried out with a reduction in the wavelength of an exposed light to be used, while it is desired that the mask should be inspected more strictly.

More specifically, in the halftone type phase shift mask of such a type as to comprise the shielding film pattern described above, when a shielding film provided on the phase shift film is subjected to patterning, a pinhole is formed on the shielding film pattern or the shielding film excessively remains so that a defect is generated. For this reason, it has been desired that the defect is reliably detected.

In an inspecting apparatus using a transmitted light for an inspecting light which is utilized for a conventional inspection of a pattern defect (for example, a KLA300 series), however, it is difficult to distinguish and recognize a difference in a transmittance between a phase shift film (a semitranslucent film) and a shielding film. For this reason, it is hard to say that all the defects of the shielding film provided on the phase shift film can be always detected reliably.

On the other hand, examples of a conventional apparatus for mainly inspecting a foreign substance on a mask include an inspecting apparatus using a reflected light for an inspecting light and an inspecting apparatus using a transmitted light and a reflected light for an inspecting light (for example, STARlight manufactured by KLA-Tencor Co., Ltd. in U.S.A.). In the case in which such a foreign substance inspecting apparatus is used, there is a problem in that the excessive defects of a shielding film can be detected only when the reflectances of a phase shift film and the shielding film are different from each other. Furthermore, there is a problem in that a phase shift film pattern and a shielding film pattern are to be distinguished and recognized to carry out an inspection in the case in which the shielding film pattern is formed in a transfer region.

Under the actual circumstances, the wavelength of an exposure wavelength obtained one generation before is used for the wavelength of an inspecting light to be used in the inspecting apparatus of a photomask, and a g ray (a wavelength of 488 [nm]) is a current mainstream and a change into a wavelength of 364 [nm], 266 [nm] or 257 [nm] has been carried out.

In relation to the change in the wavelength of the exposed light, the following problem also arises.

That is to say, the halftone type phase shift mask is to be redesigned to be adapted to a wavelength thereof with the change in the exposure wavelength. In particular, the reflectance of a film is not always constant at all wavelengths. For this reason, it is necessary to redesign a shielding film including a reflection preventing film in order to exhibit an effective reflection preventing function for an exposed light obtained after the change.

It is ideal that the shielding film is to be designed under the condition to satisfy the following equation in order to effectively prevent a reflection:

$$nd = \lambda/4$$

wherein λ represents a wavelength of an exposed light, n represents a refractive index of a film material at the wavelength λ, and d represents a thickness of the film. In the design of the shielding film, thus, it is very significant that the thickness of the film also has a value in the composition of the film material in addition to the selection of the same composition. In other words, the reflecting characteristic of the shielding film is determined by relating various elements such as the composition and the thickness of the film to each other. It is not always easy to find optimum design conditions in consideration of all the elements.

Moreover, the requirement for the shielding film is not restricted to a reflection preventing function for the exposed light. For example, in a halftone type phase shift mask of such a type as to comprise a shielding film pattern over a semitranslucent film pattern, it is desired that the shielding film should exhibit an effective reflection preventing function for a drawing laser beam in the case in which laser drawing is used when a resist is to be applied onto the shielding film of blanks and a desirable pattern is to be drawn for the resist in a process for manufacturing the halftone type phase shift mask.

The reason is that a resist pattern, and furthermore, a shielding film pattern to be formed by using the resist pattern as a mask and a semitranslucent film pattern provided thereunder cannot be formed with high precision when the drawing laser beam causes a reflection over the surface of the shielding film. A drawing laser beam in a laser drawing apparatus having a wavelength of 365 [nm] has been put to practical use. In the same manner as the exposed light, the laser beam also tends to have a reduced wavelength at present.

As described above, it is not sufficient that the shielding film exhibits the reflection preventing function for the exposed light, and the shielding film is to exhibit a predetermined reflection preventing function for the drawing laser beam. According to circumstances, therefore, the shielding film is to be redesigned every time at least one of the exposure wavelength and the wavelength of the drawing laser beam (hereinafter referred to as a laser drawing wavelength) is changed. It is very hard to find optimum design conditions which satisfy the above equation and consider a balance with the resist drawing wavelength.

Referring to a further problem, next, a finer pattern can be transferred if the wavelength of an exposed light is reduced, and a mask is to be correspondingly inspected more strictly. More specifically, in the halftone type phase shift mask, the shielding film of blanks is subjected to patterning so that a pinhole is formed on a shielding film pattern or the shielding film excessively remains so that a defect is generated in some cases. For this reason, the inspection is carried out in a final stage of the manufacture of the mask and the mask having such a defect is excluded.

There have been known two kinds of apparatuses for carrying out the inspection which are obtained by a rough division.

One of the apparatuses serves to detect the defect of an inspected film pattern based on a transmitted light intensity obtained when an inspecting light is irradiated on the inspected film pattern provided on a transparent substrate (for example, KLA-300 series manufactured by KLA-Tencor Co., Ltd. in U.S.A., for example).

The other apparatus serves to mainly detect a foreign substance stuck to an inspected film based on the intensity of a reflected light obtained by irradiating an inspecting light on an inspected film pattern provided on a transparent substrate or the intensities of both the reflected light and a transmitted light (for example, STARlight manufactured by KLA-Tencor Co., Ltd. in U.S.A.).

The former apparatus can be applied to the inspection of a halftone type phase shift mask which has been disclosed in the Patent Document 1 and cannot be applied to the inspection of a halftone type phase shift mask comprising a shielding film pattern on a semitranslucent film pattern. The reason is as follows. In the apparatus utilizing a transmitted light, the transmittance of a semitranslucent film pattern which does not substantially contribute to an exposure is recognized to be approximately 0% so that a semitranslucent film pattern cannot be distinguished from a shielding film (a transmittance of 0%) formed thereon even if a transparent substrate (a transmittance of 100%) can be distinguished from the semitranslucent film pattern.

For this reason, the latter apparatus is used for the inspection of the halftone type phase shift mask of this kind. In the same apparatus, if at least the reflectances of the semitranslucent film pattern and the shielding film pattern are varied in principle, the defect of the shielding film pattern can be detected. In the shielding film pattern defect inspection of a mask having a predetermined shielding film pattern in a transfer region, furthermore, a difference in the reflectance from the semitranslucent film pattern is indispensable. In the case in which a finer pattern is to be formed with a reduction in the wavelength of an exposed light, however, it can be supposed that a reduction in the discovery rate of a defect or a foreign substance is unavoidable.

For a countermeasure, it can be proposed that both of the reflectances is to be positively make a predetermined difference or more in order to carry out the inspection more strictly. However, the implementation has the following difficulty. More specifically, in that case, the shielding film (the shielding film pattern) is to show a predetermined difference in a reflectance in relation to the semitranslucent film (the semitranslucent film pattern) for an inspecting light while exhibiting the reflection preventing function for at least an exposed light and a drawing laser beam in respect of the problems described above. Furthermore, a reflectance capable of detecting an inspecting light has an upper limit in an inspection using a reflection, and is usually 40% or less and preferably 30% or less. Consequently, the difficulty of the design of the shielding film is caused to become more serious.

In addition, the wavelength of an inspecting light (hereinafter referred to as an inspection wavelength) also tends to be changed with a change in an exposure wavelength. More specifically, there is a tendency that an inspecting light having the same wavelength as that of an exposed light obtained one generation before is employed. More specifically, a g ray (a wavelength of 488 [nm]) is a current mainstream for an inspecting light. At present, however, a change into an inspection wavelength of 364 [nm], 266 [nm] and 257 [nm] has been carried out. According to circumstances, consequently, the shielding film is to be redesigned with the change in the inspection wavelength. Thus, it is absolutely impossible to endure the troubles.

For the foreign substance inspection of a photomask blank, furthermore, an inspection using a reflected light is carried out. At present, an inspecting light having a wavelength of 488 [nm] is used and it is necessary to correspond to the same wavelength. While the shielding film pattern is generally used as the etching mask of the semitranslucent film, moreover, a reduction in the thickness of the shielding film is also required for forming a shielding film pattern with a high resolution with the microfabrication of a pattern in recent years. Thus, it is also necessary to take the thickness of the shielding film into consideration.

SUMMARY OF THE INVENTION

It is an object of the invention to more reliably detect a defect or a foreign substance in a halftone type phase shift mask.

, it is another object of the invention to provide a technique capable of easily and accurately adjusting the reflectance and wavelength dependency of a shielding film in order to properly and rapidly carry out a redesign with a change in an exposure wavelength, a resist drawing wavelength and an inspection wavelength in a halftone type phase shift mask.

A first aspect of the invention is directed to a halftone type phase shift mask comprising, on a transparent substrate, a semitranslucent film pattern having a predetermined transmittance and phase shift amount for an exposed light and a shielding film pattern formed on the semitranslucent film pattern, wherein each of reflectances of the transparent substrate, the semitranslucent film pattern and the shielding film pattern for an inspecting light represents such a difference that the semitranslucent film pattern and the shielding film pattern can be detected based on a reflected light generated when the inspecting light is irradiated on the mask.

For the inspecting light, a longer wavelength than the wavelength of the exposed light is provided and a light having a longer wavelength than 200 nanometers is used, for example. More specifically, a light having a wavelength of 364 nanometers or a light having a wavelength of 257 nanometers is used for the inspecting light.

According to a specific aspect of the invention, there is also provided the halftone type phase shift mask according to the first aspect which has such a structure that a difference in a reflectance between the transparent substrate and the semitranslucent film pattern, a difference in a reflectance between the semitranslucent film pattern and the shielding film pattern and a difference in a reflectance between the transparent substrate and the shielding film pattern are 3% or more for the inspecting light.

The wavelength dependency of the reflectance in each of the shielding film pattern and the semitranslucent film pattern can be controlled by the material and thickness of the pattern, for example.

According to a specific aspect of the invention, there is also provided a halftone type phase shift mask having a transmittance of 3 to 40% and a semitranslucent film pattern having a phase shift amount of approximately 180 degrees for an exposed light.

According to a more specific aspect of the invention, there is provided the halftone type phase shift mask according to any of the aspects which has such a structure that each of the reflectances of the transparent substrate, the semitranslucent film pattern and the shielding film pattern is 30% or less for the exposed light.

A second aspect of the invention is directed to the halftone type phase shift mask according to any of the aspects, wherein the exposed light has a wavelength of 200 nanometers or less.

More specifically, a light having a wavelength of 193 nanometers and a wavelength of 157 nanometers can be used for the exposed light.

A third aspect of the invention is directed to the halftone type phase shift mask according to any of the aspects, wherein the shielding film pattern is formed on the semitranslucent film pattern in a transfer region.

A fourth aspect of the invention is directed to the halftone type phase shift mask according to any of the aspects, wherein the semitranslucent film pattern is constituted to have a transmittance of 8 to 30%.

As in the fourth aspect, in the case in which the transmittance of the semitranslucent film pattern is to be increased, it is preferable that the shielding film pattern should be formed also in the transfer region of the mask.

A fifth aspect of the invention is directed to the halftone type phase shift mask according to any of the aspects, wherein the most surface side of the shielding film pattern contains chromium and oxygen.

In the fifth aspect, the most surface side of the shielding film pattern may further contain nitrogen. In that case, the wavelength dependency of the reflectance in the shielding film pattern can be controlled by the content of the nitrogen.

According to a preferred aspect of the invention, there is also provided the halftone type phase shift mask according to any of the aspects which has such a structure that the most surface side of the shielding film pattern contains chromium and oxygen and does not contain nitrogen.

It is preferable that the shielding film pattern should be constituted to exhibit a sufficient shielding property for the exposed light in a combination with the semitranslucent film pattern.

According to a specific aspect of the invention, therefore, there is provided the halftone type phase shift mask according to any of the aspects wherein the thickness of the shielding film pattern is 60 nanometers or less.

According to another aspect of the invention, moreover, there is provided the halftone type phase shift mask according to any of the aspects wherein the transmittance of a laminated film having the shielding film pattern and the semitranslucent film pattern is 0.1% or less for the exposed light.

A sixth aspect of the invention is directed to a halftone type phase shift mask blank to be used as a material for manufacturing the halftone type phase shift mask according to any of the aspects.

According to a seventh aspect of the invention, there is provided a method of adjusting a reflectance and wavelength dependency of a shielding film in a halftone type phase shift mask blank comprising, on a transparent substrate, a semitranslucent film having a predetermined transmittance and phase shift amount for an exposed light and the shielding film formed on the semitranslucent film, wherein an uppermost layer portion of the shielding film is set to be a reflectance adjusting section containing chromium, carbon, oxygen and nitrogen, and the reflectance and wavelength dependency of the whole shielding film is adjusted based on a content rate of the nitrogen in the reflectance adjusting section.

According to a eighth aspect of the invention, there is provided a method of manufacturing a halftone type phase shift mask blank comprising a semitranslucent film forming step of forming, on a transparent substrate, a semitranslucent film having a predetermined transmittance and phase shift amount for an exposed light and a shielding film forming step of forming a shielding film on the semitranslucent film, wherein the shielding film forming step includes a reflectance adjusting section forming step of carrying out sputtering film formation using a target made of chromium in an atmosphere containing carbon, oxygen and nitrogen, thereby forming a reflectance adjusting section in a portion to be an uppermost layer of the shielding film, and a partial pressure of the nitrogen in the atmosphere is set to have such a value that the shielding film has a desirable reflectance and wavelength dependency at the reflectance adjusting section forming step.

According to a ninth aspect of the invention, there is provided the method of manufacturing a halftone type phase shift mask blank, wherein the atmosphere containing the carbon, the oxygen and the nitrogen is an atmosphere containing carbon dioxide ($CO_2$) and nitrogen ($N_2$).

According to a tenth aspect of the invention, there is provided a halftone type phase shift mask blank comprising, on a transparent substrate, a semitranslucent film having a predetermined transmittance and phase shift amount for an exposed light and a shielding film formed on the semitranslucent film, wherein an uppermost layer portion of the shielding film is set to be a reflectance adjusting section containing chromium, carbon, oxygen and nitrogen, and a reflectance of a surface of the shielding film is 30% or less for all of a wavelength of an exposed light and a wavelength of a laser beam of a laser drawing apparatus for forming a shielding film pattern.

According to a eleventh aspect of the invention, there is provided the halftone type phase shift mask blank, wherein reflectances of the transparent substrate, the semitranslucent film and the shielding film for an inspecting light are different from each other by 3% or more.

According to a twelfth aspect of the invention, there is provided a halftone type phase shift mask manufactured by using the halftone type phase shift mask blank.

According to a thirteenth aspect of the invention, there is provided a halftone type phase shift mask blank comprising, on a transparent substrate, a semitranslucent film having a predetermined transmittance and phase shift amount for an exposed light and a shielding film formed on the semitranslucent film, wherein an uppermost layer portion of the shielding film is set to be a reflectance adjusting section containing chromium, carbon, oxygen and nitrogen and the whole shielding film including the reflectance adjusting section has a thickness of 60 [nm] or less.

According to a fourteenth aspect of the invention, there is provided a halftone type phase shift mask blank comprising, on a transparent substrate, a semitranslucent film having a predetermined transmittance and phase shift amount for an exposed light and a shielding film formed on the semitranslucent film, wherein the shielding film has a ground section on the semitranslucent film side and has a reflectance adjusting section on the ground section, the ground section does not contain oxygen or has a content rate of the oxygen to be 10 atomic % or less, and the reflectance adjusting section has a content rate of the oxygen to be 20 atomic % or more.

According to a fifteenth aspect of the invention, there is provided the halftone type phase shift mask blank, wherein the reflectance adjusting section contains 20 to 50 atomic % of chromium, 5 to 20 atomic % of carbon, 20 to 50 atomic % of oxygen and 5 to 40 atomic % of nitrogen.

According to a sixteenth aspect of the invention, there is provided a halftone type phase shift mask formed by using the halftone type phase shift mask blank in accordance with any of the seventh to ninth aspects.

According to a seventeenth aspect of the invention, there is provided a halftone type phase shift mask comprising, on a transparent substrate, a semitranslucent film pattern having a predetermined transmittance and phase shift amount for an exposed light and a shielding film pattern formed on the semitranslucent film pattern, wherein each of reflectances of the transparent substrate, the semitranslucent film pattern and the shielding film pattern for an inspecting light represents such a difference that the semitranslucent film pattern and the shielding film pattern can be detected based on a reflected light obtained when the inspecting light is irradiated on the mask.

For the inspecting light, it is possible to use a light having a greater wavelength than that of the exposed light, for example, a greater wavelength than 200 [nm]. More specifically, it is possible to use a light having a wavelength of 364 [nm], 266 [nm] or 257 [nm] as the inspecting light.

According to an eighteenth aspect of the invention, there is also provided the halftone type phase shift mask, wherein all of a difference in a reflectance between the transparent substrate and the semitranslucent film pattern, a difference in a reflectance between the semitranslucent film pattern and the shielding film pattern, and a difference in a reflectance between the transparent substrate and the shielding film pattern are 3% or more for the inspecting light.

The wavelength dependency of the reflectance in the shielding film pattern or the semitranslucent film pattern can be controlled based on the material and film thickness of each of the patterns, for example.

Moreover, it is suitable that the semitranslucent film pattern should have a transmittance of 3 to 40% and a phase shift amount of approximately 180 degrees for the exposed light.

According to a nineteenth aspect of the invention, there is provided the halftone type phase shift mask, wherein all the reflectances of the transparent substrate, the semitranslucent film pattern and the shielding film pattern are 30% or less for the exposed light.

According to a twentieth aspect of the invention, there is provided the halftone type phase shift mask, wherein the exposed light has a wavelength of 200 [nm] or less. More specifically, a light having a wavelength of 193 [nm] or a light having a wavelength of 157 [nm] can be used for the exposed light.

According to a twenty first aspect of the invention, there is provided the halftone type phase shift mask, wherein the shielding film pattern is formed on the semitranslucent film pattern in a transfer region.

According to a twenty second aspect of the invention, there is provided the halftone type phase shift mask, wherein the semitranslucent film pattern has a transmittance of 8 to 30%. In the case in which the semitranslucent film pattern is caused to have a transmittance increased as in the sixteenth aspect, it is preferred that the shielding film pattern should be formed also in the transfer region of the mask.

According to a twenty third aspect of the invention, there is provided the halftone type phase shift mask, wherein the most surface side of the shielding film pattern contains chromium and oxygen. In the seventeenth aspect, nitrogen may be further contained on the most surface side of the shielding film pattern. In that case, the wavelength dependency of the reflectance in the shielding film pattern can be controlled by the content of the nitrogen.

It is preferable that the shielding film pattern should be constituted to exhibit a sufficient shielding property for the exposed light in a combination with the semitranslucent film pattern. According to a twenty fourth aspect of the invention, there is provided the halftone type phase shift mask, wherein the shielding film pattern has a thickness of 60 [nm] or less.

According to a twenty fifth aspect of the invention, there is provided the halftone type phase shift mask, wherein a laminated film including the shielding film pattern and the semitranslucent film pattern has a transmittance of 0.1% or less for the exposed light.

According to the invention, there is also provided a halftone type phase shift mask blank to be used as a material for manufacturing the halftone type phase shift mask in accordance with any of the aspects.

In the case in which chromium, carbon, oxygen and nitrogen are selected for the constitutional elements of the reflectance adjusting section, the content rate of the nitrogen and the reflectance and wavelength dependency of the shielding film have a correlation. In the portion in which the reflectance and wavelength dependency of the shielding film can be adjusted based on the content rate of the nitrogen in the reflectance adjusting section, moreover, the reflectance and wavelength dependency is not extremely changed with the content rate of the nitrogen but is changed gradually. Therefore, the reflectance and wavelength dependency of the shielding film can be finely adjusted accurately and easily. In particular, a partial pressure of $N_2$ is controlled by using $CO_2$ and $N_2$ as reactive gases during sputtering. Consequently, the reflectance and wavelength dependency of the shielding film can be controlled well. Thus, it is possible to easily implement a shielding film indicative of a predetermined difference in a reflectance based on a relationship with a semitranslucent film (a semitranslucent film pattern) for an inspecting light while exhibiting a reflection preventing function for at least an exposed light and a drawing laser beam.

DESCRIPTION OF THE PREFERRED EMBODIMENTS

Figure 1:
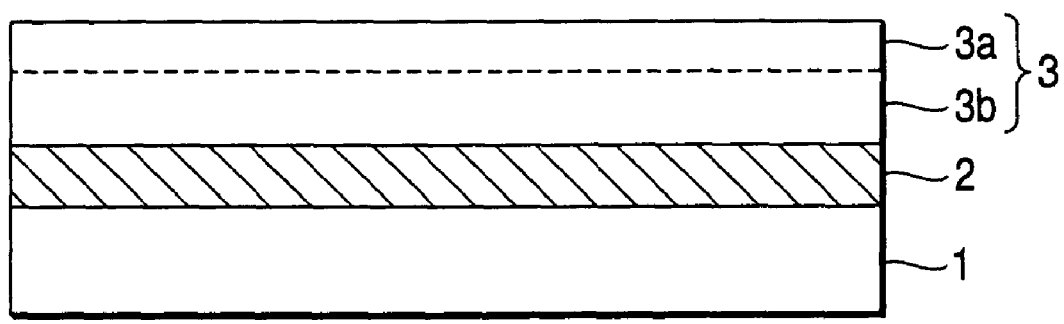
FIG. 1 is a schematic sectional view showing the structure of a halftone type phase shift mask blank according to an embodiment.

FIG. 1 is a schematic sectional view showing the structure of a halftone type phase shift mask blank according to an embodiment. The halftone type phase shift mask blank has a transparent substrate 1 having a light transmitting property, a semitranslucent film 2 formed on the transparent substrate 1, and a shielding film 3 formed on the semitranslucent film 2.

The semitranslucent film 2 has a predetermined transmittance and phase shift amount for an exposed light. More specifically, the semitranslucent film 2 has a transmittance of 3 to 40% and a phase shift amount of approximately 180 degrees for the exposed light.

The shielding film 3 is constituted to exhibit a sufficient shielding property for an exposed light when the shielding film 3 and the semitranslucent film 2 are laminated. More specifically, the thickness of the shielding film 3 is set to be 50 nm or less.

Moreover, a reflectance adjusting section 3a having a proper thickness is formed on the most surface side of the shielding film 3. The reflectance adjusting section 3a is constituted to include at least chromium and oxygen and exhibits a reflection preventing function for the exposed light. Moreover, a wavelength dependency for the reflectance of the whole shielding film 3 can be controlled based on the thickness and composition of the reflectance adjusting section 3a.

Further, the shielding film 3 also includes a ground section 3b on the semitranslucent film 2 side and a reflectance adjusting section 3a provided on the ground section 3b in the direction of a thickness thereof. The shielding film 3 is constituted to exhibit a sufficient shielding property for an exposed light when the shielding film 3 and the semitranslucent film 2 are laminated.

It is preferable that the reflectance adjusting section 3a should be formed as a single layer (film). In the case in which a whole or part of the shielding film 3 has such a structure that a composition is continuously changed in the direction of the thickness of the film, the reflectance adjusting section 3a may be a part of a continuous film. In any case, a portion in the shielding film 3 excluding the reflectance adjusting section 3a becomes the ground section 3b.

The reflectance adjusting section 3a is formed of chromium, carbon, oxygen and nitrogen. The content rate of the oxygen is 20 atomic % or more. In detail, the reflectance adjusting section 3a contains 20 to 50 atomic % of chromium, 5 to 20 atomic % of carbon, 20 to 50 atomic % of oxygen and 5 to 40 atomic % of nitrogen.

The ground section 3b contains metal such as chromium as a principal component and the content rate of the oxygen is set to be 10 atomic % or less (including zero) in order to exhibit a high shielding function with a small film thickness. Consequently, it is possible to set the thickness of the whole shielding film 3 to be 60 [nm] or less while employing chromium, carbon, oxygen and nitrogen as the constitutional elements of the reflectance adjusting section 3a.

Specific description will be given to a method of manufacturing the halftone type phase shift mask blank and a method of manufacturing a halftone type phase shift mask using the halftone type phase shift mask blank.

[First Embodiment]

First of all, a substrate formed of quartz was mirror polished and was subjected to predetermined washing. Consequently, a transparent substrate 1 having a length of 6 inches, a width of 6 inches and a thickness of 0.25 inch was obtained.

Next, the transparent substrate 1 thus obtained was loaded into a stationary opposed type sputtering apparatus and reactive sputtering was carried out in a mixed gas atmosphere containing argon (Ar), nitrogen ($N_2$) and oxygen ($O_2$) (Ar flow rate=10 [sccm], $N_2$ flow rate=31 [sccm], $O_2$ flow rate=5 [sccm], a gas pressure of 0.05 [Pa]) by using a mixed target of molybdenum (Mo) and silicon (Si) (Mo:Si=8:92 [mol %]). Consequently, a MoSiON based semitranslucent film 2 was formed in a thickness of 74 [nm] on the transparent substrate 1.

Then, a heat treatment was carried out over the semitranslucent film 2 at 200° C. for 10 minutes by using a hot plate type annealing apparatus. The semitranslucent film 2 thus obtained has a transmittance of 9% and a phase shift amount (a phase angle) of approximately 180 degrees for an exposed light.

Next, a first shielding film 31 and a second shielding film 32 to be a reflectance adjusting section 3a were formed on the semitranslucent film 2 by using a stationary opposed type sputtering apparatus. Consequently, a shielding film 3 was constituted so that a halftone type phase shift mask blank according to a first embodiment was obtained.

In detail, first of all, the first shielding film 31 comprising CrN having a thickness of 400 [Å] (which implies that chromium and nitrogen are contained and their contents are not defined and so forth) was formed on the semitranslucent film 2 by reactive sputtering in a mixed gas atmosphere of Ar and $N_2$ (Ar flow rate=18.2 [sccm], $N_2$ flow rate=7.8 [sccm], a gas pressure of 0.04 [Pa]) by using a chromium target in a stationary opposed type sputtering apparatus.

At this time, a sputter power was set to be 1.5 [kw].

Then, the second shielding film 32 comprising CrCO having a thickness of 60 [Å] was formed on the first shielding film 31 by the reactive sputtering in a mixed gas atmosphere of Ar and $CO_2$ (Ar flow rate=20 [sccm], $CO_2$ flow rate=33.3 [sccm], a gas pressure of 0.126 [Pa]) by using the chromium target in the stationary opposed type sputtering apparatus.

At this time, the sputter power was set to be 1.0 [kw].

Figure 2:
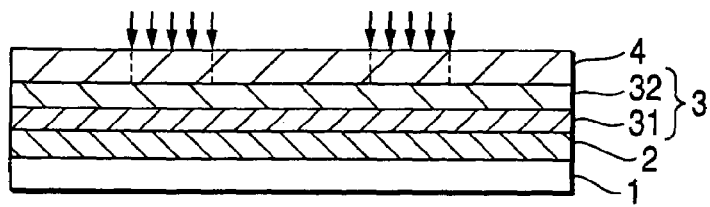
FIGS. 2a through 2h are views for explaining a method of manufacturing a halftone type phase shift mask according to the embodiment.
Figure 2:
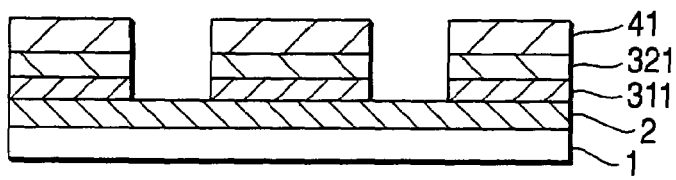
Figure 2:
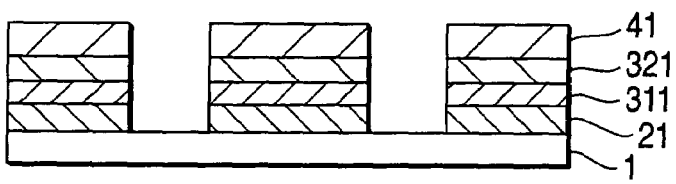
Figure 2:
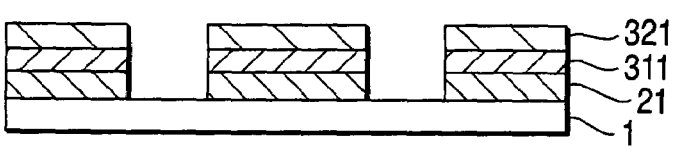
Figure 2:
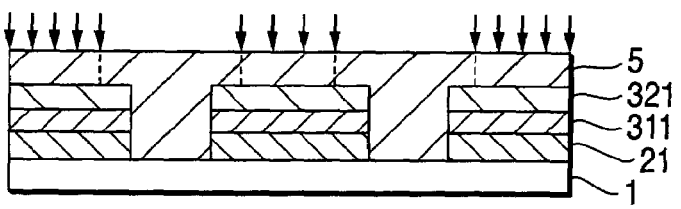
Figure 2:
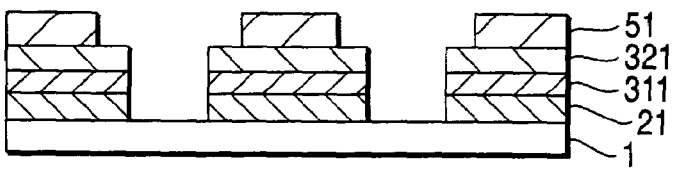
Figure 2:
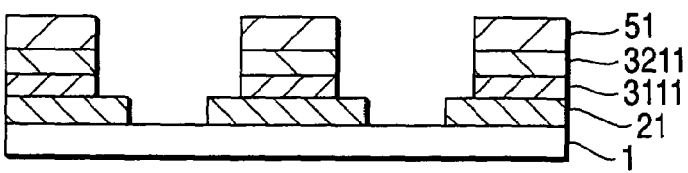
Figure 2:
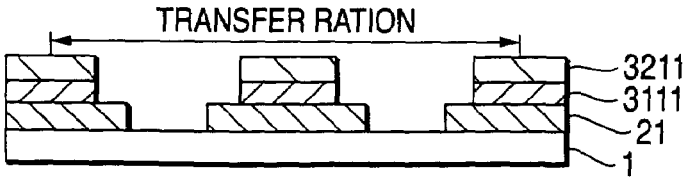

Thereafter, the shielding film 3 was coated with a positive electron beam resist (ZEP7000 manufactured by NIPPON ZEON Co., Ltd.) 4 in a thickness of 500 [nm] by spin coating (see FIG. 2(a)).

Subsequently, a predetermined pattern was drawn with an electron beam over the positive electron beam resist 4 by means of MEBES manufactured by ETEC Co., Ltd. and was then developed to form a first resist pattern 41.

Next, the first resist pattern 41 was utilized as a mask to pattern the shielding film 3 by dry etching using chlorine and oxygen. Consequently, a first shielding film pattern 311 and a second shielding film pattern 321 were formed (see FIG. 2(b)).

Then, the first resist pattern 41, the first shielding film pattern 311 and the second shielding film pattern 321 were utilized as masks to carry out dry etching over the semitranslucent film 2 by using a mixed gas of $CF_4/O_2$ at a pressure of 0.4 [Torr] and an RF power of 100 [W]. Thus, a semitranslucent film pattern 21 was formed (FIG. 2(c)).

Thereafter, the first resist pattern 41 was stripped so that an intermediate product of a halftone type phase shift mask patterned up to a first stage was obtained (see FIG. 2(d)).

Subsequently, a photoresist (AZ1350 manufactured by Geeplay Co., Ltd.) 5 was applied to have a thickness of 500 [nm] by spin coating and was then baked (FIG. 2(e)).

Next, programs to be a shielding band in the outer peripheral portion of a transfer region and a shielding film pattern on a semitranslucent film pattern in the transfer region were superposed and exposed by ALTA3000 manufactured by ETEC Co., Ltd. and were then developed to form a second resist pattern 51 (see FIG. 2(f)).

Then, the second resist pattern 51 was utilized as a mask to further pattern the first shielding film pattern 311 and the second shielding film pattern 321 by using an etchant containing cerium (II) ammonium nitrate and perchloric acid. Consequently, a first shielding film pattern 3111 and a second shielding film pattern 3211 were finished (see FIG. 2(g)).

A shielding film pattern is constituted by the first shielding film pattern 3111 and the second shielding film pattern 3211. The shielding film pattern is formed on the semitranslucent film with the end of the semitranslucent film exposed in such a manner that a side lobe light can be reduced and a predetermined phase shift effect can be produced in the transfer region of the mask.

Next, the second resist pattern 51 was stripped and predetermined washing was then carried out. Consequently, the halftone phase shift mask according to the first embodiment was obtained (see FIG. 2(h)).

[Second Embodiment]

As a variant of the first embodiment, only the structure of a second shielding film 32 to be a reflectance adjusting section 3a was changed.

More specifically, in a halftone type phase shift mask blank according to a second embodiment, a second shielding film comprising CrO having a thickness of 50 [Å] was formed on a first shielding film 31 by reactive sputtering in a mixed gas atmosphere of Ar and $O_2$ (Ar flow rate=20 [sccm], $O_2$ flow rate=50 [sccm], a gas pressure of 0.127 [Pa]) using a chromium target in a stationary opposed type sputtering apparatus. At this time, a sputter power was set to be 1.0 [kw].

By using the halftone type phase shift mask blank, a halftone type phase shift mask according to the second embodiment was obtained by the same method as that in the first embodiment.

[Third Embodiment]

As a variant of the first embodiment, only the structure of a second shielding film 32 to be a reflectance adjusting section 3a was changed.

More specifically, in a halftone type phase shift mask blank according to a third embodiment, a second shielding film comprising CrCON having a thickness of 160 [Å] was formed on a first shielding film 31 by reactive sputtering in a mixed gas atmosphere of Ar, $N_2$ and $CO_2$ (Ar flow rate=20 [sccm], $N_2$ flow rate=23.9 [sccm], $CO_2$ flow rate=9.4 [sccm], a gas pressure of 0.092 [Pa]) using a chromium target in a stationary opposed type sputtering apparatus. At this time, a sputter power was set to be 1.0 [kw].

By using the halftone type phase shift mask blank, a halftone type phase shift mask according to the third embodiment was obtained by the same method as that in the first embodiment.

[Result of Measurement of Optical Characteristic]

For each of the halftone phase shift masks obtained in the first to third embodiments, a test light was irradiated to measure the reflectances of a transparent substrate 1, a semitranslucent film 2 (or a semitranslucent film pattern and so forth), and a shielding film 3 (or a shielding film pattern and so forth).

HITACHI spectrophotometer U-4000 was used for the measurement of the reflectances.

Figure 3:
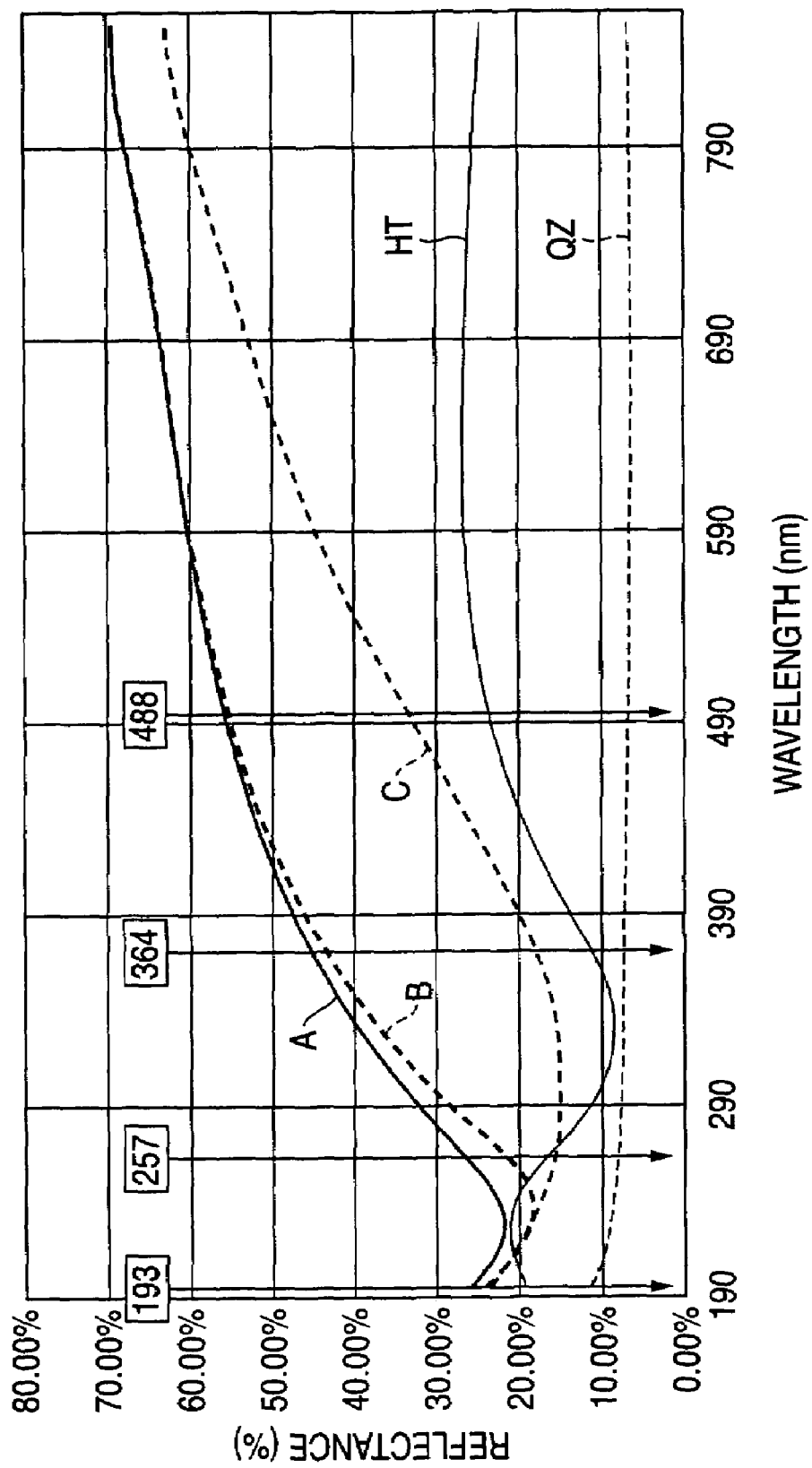
FIG. 3 is a chart showing the reflectance and wavelength dependency of the halftone type phase shift mask according to the embodiment.

The result of the measurement is shown in FIG. 3. FIG. 3 shows a reflectance curve, in which an axis of ordinate indicates a reflectance (%) and an axis of abscissa indicates a wavelength [nm] of a test light. In FIG. 3, A, B and C indicate the reflectance curves of the shielding film 3 according to the first, second and third embodiments, respectively. HT indicates the reflectance curve of the semitranslucent film 2. QZ indicates the reflectance curve of the transparent substrate 1. The semitranslucent film and the transparent substrate are common to all of the first, second and third embodiments.

As is apparent from FIG. 3, the halftone phase shift masks according to the embodiments are constituted to have such a first wavelength region that all of a difference in the reflectance between the transparent substrate and the semitranslucent film pattern, a difference in the reflectance between the semitranslucent film pattern and the shielding film pattern and a difference in the reflectance between the transparent substrate and the shielding film pattern are 3% or more.

According to the studies of the inventor, it is apparent that the difference between the reflectances can be recognized in an inspecting apparatus if the difference in the reflectance among the transparent substrate, the semitranslucent film pattern and the shielding film pattern is thus 3% or more. The difference between the reflectances is preferably 5% or more, and more preferably 10% or more.

More specifically, if the difference in the reflectance between the transparent substrate and the semitranslucent film pattern is 3% or more (preferably 5% or more and more preferably 10% or more), the semitranslucent film pattern can reliably be detected in the inspecting apparatus.

Moreover, if the difference in the reflectance between the semitranslucent film pattern and the shielding film pattern is 3% or more (preferably 5% or more and more preferably 10% or more), the shielding film pattern can reliably be detected in the inspecting apparatus.

As a result, the defect of the mask can reliably be detected in the inspecting apparatus.

Referring to the first and second embodiments, the first wavelength region has a wavelength of approximately 200 [nm] or more. Referring to the halftone type phase shift mask according to the first and second embodiments, therefore, a light having a wavelength of 200 [nm] or more can be used for an inspecting light.

Referring to the third embodiment, moreover, the first wavelength region has a wavelength of approximately 290 [nm] or more. Referring to the halftone type phase shift mask according to the third embodiment, therefore, a light having a wavelength of 290 [nm] or more can be used for the inspecting light.

As is apparent from FIG. 3, moreover, each of the halftone phase shift masks according to the embodiments has such a structure that the shielding film pattern has a higher reflectance than that of the semitranslucent film pattern in the first wavelength region. Consequently, the halftone phase shift mask is particularly preferable for inspecting a defect such as residual chromium or a pinhole.

As shown in FIG. 3, furthermore, each of the halftone phase shift masks according to the embodiments is constituted to further have a second wavelength region in which each of the reflectances of the transparent substrate, the semitranslucent film pattern and the shielding film pattern is 30% or less.

If each of the reflectances for an exposed light is 30% or less, the generation of a standing wave for the exposed light is prevented so that precision in a transfer pattern can be enhanced. Also in the case in which the halftone type phase shift mask is used as a reticle, moreover, a bad influence can be prevented from being exerted by the irregular reflection of a light in the exposure of a stepper.

If each of the reflectances for a laser beam to be used for a laser drawing light source for the positive electron beam resist 4 as well as an exposed light in the execution of a pattern transfer using the halftone phase shift mask is 30% or less, furthermore, it is possible to enhance precision in the dimension of the halftone type phase shift mask itself.

In all the embodiments, the second wavelength region has a wavelength of 200 [nm] or less. In this case, more specifically, a light having a wavelength of 193 [nm] or 157 [nm] or less can be therefore used for the exposed light.

In the third embodiment, furthermore, the second wavelength region also includes a region having a wavelength of approximately 460 [nm] or less. Therefore, a laser beam having a wavelength of 460 [nm] or less, more specifically, 364 [nm], 266 [nm] or 257 [nm] can be suitably used

[As to Reflectance Curve of Shielding Film]

As shown in FIG. 3, the shielding films according to the first to third embodiments are similar to each other in that a reflectance for an inspection wavelength region is greater than that for an exposure wavelength region.

In the reflectance curves A and B of the shielding films according to the first and second embodiments, however, the reflectances steeply rise from the vicinity of 200 [nm] with an increase in the wavelength. On the other hand, in the reflectance curve C of the shielding film according to the third embodiment, the reflectance broadly rises with the increase in the wavelength. In this respect, both of them are different from each other.

In a comparison between the shielding films according to the first and second embodiments and the shielding film according to the third embodiment, the former reflectance adjusting section 3a does not contain nitrogen at all and the latter reflectance adjusting section contains the nitrogen as described above.

For this reason, it can be supposed that the wavelength dependency of the reflectance in the shielding film can be controlled in an amount of the nitrogen contained in the reflectance adjusting section 3a.

The reflectance curves A and B of the shielding films according to the first and second embodiments show a steep rise. In the halftone type phase shift masks according to the first and second embodiments, therefore, a light having a wavelength of 257 [nm] as well as a light having a wavelength of 364 [nm] can suitably be used as inspecting lights.

On the other hand, the reflectance curve C of the shielding film according to the third embodiment shows a broad rise. In the halftone type phase shift mask according to the third embodiment, therefore, there is a fear that the inspecting apparatus cannot recognize a contrast of a shielding film pattern and a semitranslucent film pattern when the light having the wavelength of 257 [nm] is used as the inspecting light.

It is preferable that the reflectance adjusting section 3a should not contain the nitrogen in that a high contrast of a shielding film and a semitranslucent film is to be taken at a defect inspection wavelength.

While the first to third embodiments have been considered above with reference to FIG. 3, specific numeric values read from FIG. 3 are shown in the following Tables 1 and 2.

Table 1 shows the relationships between wavelengths and reflectances for a transparent substrate (QZ) and a semitranslucent film (HT). These are common to the first to third embodiments.

TABLE 1

| Wavelength (nm) | Semitranslucent film | Substrate |
|---|---|---|
| 193 | 19.75% | 10.72% |
| 257 | 16.07% | 7.90% |
| 266 | 14.31% | 7.78% |
| 364 | 11.16% | 7.07% |
| 488 | 23.95% | 6.82% |

The Table 2 shows the relationships between wavelengths and reflectances for the shielding films (A, B and C) according to the first to third embodiments.

TABLE 2

| Wavelength (nm) | First embodiment | Second embodiment | Third embodiment |
|---|---|---|---|
| 193 | 24.65% | 23.92% | 22.37% |
| 257 | 26.59% | 21.82% | 15.42% |
| 266 | 28.56% | 24.13% | 15.10% |
| 364 | 45.33% | 43.32% | 17.76% |
| 488 | 55.70% | 55.36% | 33.49% |

While the preferred embodiments of the invention have been described above, the invention is not restricted thereto.

For example, in the halftone type phase shift mask blank according to the invention, the shielding film 3 may be formed by using an inline type sputtering apparatus in place of the stationary opposed type sputtering apparatus using a batch method or a sheet method. In that case, the shielding film 3 is constituted in such a manner that the component is continuously changed in the direction of a thickness thereof.

Moreover, the halftone type phase shift mask may be constituted in such a manner that the reflectance of a semitranslucent film pattern is higher than that of a shielding film pattern for an inspecting light.

Furthermore, the materials of the shielding film pattern and the semitranslucent film pattern are not particularly restricted to the embodiments.

The semitranslucent film 2 can be constituted by a single layer substantially comprising metal, silicon, nitrogen and/or oxygen or a laminated layer thereof.

Moreover, the semitranslucent film 2 may be constituted by a multilayer structure having a high transmittance layer and a low transmittance layer. In this case, the high transmittance layer can substantially comprise silicon and nitrogen, and/or oxygen or can contain a very small amount of metal such as chromium, molybdenum, tantalum, tungsten, zirconium or hafnium in addition thereto. Furthermore, the low transmittance layer can be constituted by at least one material selected from magnesium, aluminum, titanium, vanadium, chromium, yttrium, zirconium, niobium, molybdenum, tin, lanthanum, tantalum, tungsten, silicon and hafnium.

[Fourth Embodiment]

As a fourth embodiment of this invention, a heat treatment was carried out in the same way as that of being performed in the first embodiment so that the semitranslucent film 2 is obtained having a transmittance of 9% and a phase shift amount (a phase angle) of approximately 180 degrees for an exposed light.

Next, the first shielding film 31 (see FIG. 2(a)) comprising CrN having a thickness of 400 [Å] (which implies that chromium and nitrogen are contained and their content rates are not defined and so forth) was formed on the semitranslucent film 2 by reactive sputtering in a mixed gas atmosphere of Ar and $N_2$ (Ar flow rate=18.2 [sccm], $N_2$ flow rate=7.8 [sccm], a gas pressure of 0.04 [Pa]) using a chromium target in a stationary opposed type sputtering apparatus. At this time, a sputter power was set to be 1.5 [kw].

Then, the second shielding film 32 (see FIG. 2(a)) comprising CrCON (which implies that chromium, carbon, oxygen and nitrogen are contained and their content rates are not defined and so forth) having a thickness of 161 [Å] was formed on the first shielding film 31 by the reactive sputtering in a mixed gas atmosphere of an Ar gas to be an inactive gas, $N_2$ and $CO_2$ gases to be raw material gases (Ar flow rate=20 [sccm], $N_2$ flow rate=17 [sccm], $CO_2$ flow rate=17 [sccm]) using the chromium target in the stationary opposed type sputtering apparatus. At this time, the sputter power was set to be 1.0 [kw] and a time required for the formation of the film was set to be 4.5 minutes.

For the inactive gas, Ne and Kr as well as Ar can be used.

In the process described above, the halftone type phase shift mask blank according to the first embodiment was obtained. In the halftone type phase shift mask blank, the first shielding film 31 corresponds to the ground section 3b and the second shielding film 32 corresponds to the reflectance adjusting section 3a. A shielding film 3 is constituted by the first shielding film 31 and the second shielding film 32. Description will be given to a method of manufacturing a halftone type phase shift mask using the halftone type phase shift mask blank.

First of all, the shielding film 3 of the halftone type phase shift mask blank was coated with a positive electron beam resist (ZEP7000 manufactured by NIPPON ZEON Co., Ltd.) 4 in a thickness of 500 [nm] by spin coating (see FIG. 2(a)).

Subsequently, a predetermined pattern was drawn with an electron beam over the positive electron beam resist film 4 by means of an electron beam drawing apparatus (MEBES manufactured by ETEC Co., Ltd.) and was then developed to form a first resist pattern 41. Then, the first resist pattern 41 was set to be a mask to pattern the shielding film 3 by dry etching using chlorine and oxygen. Consequently, a first shielding film pattern 311 and a second shielding film pattern 321 were formed (see FIG. 2(b)).

Then, the first resist pattern 41, the first shielding film pattern 311 and the second shielding film pattern 321 were set to be masks to carry out dry etching over the semitranslucent film 2 by using a mixed gas of $CF_4/O_2$ at a pressure of 0.4 [Torr] and an RF power of 100 [W]. Thus, a semitranslucent film pattern 21 was formed (see FIG. 2(c)).

Thereafter, the first resist pattern 41 was stripped so that an intermediate product of a halftone type phase shift mask patterned up to a first stage was obtained (see FIG. 2(d)).

Subsequently, a photoresist (AZ1350 manufactured by Geeplay Co., Ltd.) 5 was applied to have a thickness of 500 [nm] by spin coating and was then baked. Next, programs to be a shielding band in the outer peripheral portion of a transfer region and a shielding film pattern on a semitranslucent film pattern in the transfer region were superposed and exposed by a laser drawing apparatus (ALTA3000 manufactured by ETEC Co., Ltd., a laser wavelength: 365 [nm]) (see FIG. 2(e)).

Thereafter, the photoresist 5 thus exposed was developed to form a second resist pattern 51 (FIG. 2(f)).

Then, the second resist pattern 51 was set to be a mask to further pattern the first shielding film pattern 311 and the second shielding film pattern 321 by using an etchant containing cerium (II) ammonium nitrate and perchloric acid. Consequently, a first shielding film pattern 3111 and a second shielding film pattern 3211 were formed (see FIG. 2(g)).

The first shielding film pattern 3111 and the second shielding film pattern 3211 constitute a shielding film pattern. The shielding film pattern is formed in such a manner that the end of the semitranslucent film pattern 21 in the transfer region is exposed as seen on a plane. In the transfer region of the mask, consequently, a side lobe light can be reduced and a desirable phase shift effect can be produced.

Next, the second resist pattern 51 was stripped and predetermined washing was then carried out. Consequently, the halftone type phase shift mask according to the first embodiment was obtained (see FIG. 2(h)).

[Fifth Embodiment]

As a variant of the first embodiment, there was manufactured a halftone type phase shift mask blank in which only the structure of a second shielding film 32 to be a reflectance adjusting section 3a is changed.

More specifically, in a halftone type phase shift mask blank according to a second embodiment, a second shielding film 32 comprising CrCON having a thickness of 179 [Å] was formed on a first shielding film 31 by reactive sputtering in a mixed gas atmosphere of an Ar gas to be an inactive gas and $N_2$ and $CO_2$ gases to be raw material gases (Ar flow rate=20 [sccm], $N_2$ flow rate=21 [sccm], $CO_2$ flow rate=12 [sccm]) using a chromium target in a stationary opposed type sputtering apparatus. At this time, a sputter power was set to be 1.0 [kw] and a time required for the formation of the film was set to be 4.5 minutes.

In other respects, the halftone type phase shift mask blank according to the second embodiment was obtained in the same manner as in the first embodiment and the same patterning as described above was carried out to obtain a halftone type phase shift mask according to the second embodiment.

[Sixth Embodiment]

As a variant of the fourth embodiment, there was manufactured a halftone type phase shift mask blank in which only the structure of a second shielding film 32 to be a reflectance adjusting section 3a is changed.

More specifically, in a halftone type phase shift mask blank according to a sixth embodiment, a second shielding film 32 comprising CrCON having a thickness of 163 [Å] was formed on a first shielding film 31 by reactive sputtering in a mixed gas atmosphere of an Ar gas to be an inactive gas and $N_2$ and $CO_2$ gases to be raw material gases (Ar flow rate=20 [sccm], $N_2$ flow rate=23 [sccm], $CO_2$ flow rate=10 [sccm]) using a chromium target in a stationary opposed type sputtering apparatus. At this time, a sputter power was set to be 1.0 [kw] and a time required for the formation of the film was set to be 3.5 minutes.

In other respects, the halftone type phase shift mask blank according to the sixth embodiment was obtained in the same manner as in the fourth embodiment and the same patterning as described above was carried out to obtain a halftone type phase shift mask according to the sixth embodiment.

[Seventh Embodiment]

As a variant of the first embodiment, there was manufactured a halftone type phase shift mask blank in which only the structure of a second shielding film 32 to be a reflectance adjusting section 3a is changed.

More specifically, in a halftone type phase shift mask blank according to a seventh embodiment, a second shielding film 32 comprising CrCON having a thickness of 159 [Å] was formed on a first shielding film 31 by reactive sputtering in a mixed gas atmosphere of an Ar gas to be an inactive gas and $N_2$ and $CO_2$ gases to be raw material gases (Ar flow rate=20 [sccm], $N_2$ flow rate=24 [sccm], $CO_2$ flow rate=9 [sccm]) using a chromium target in a stationary opposed type sputtering apparatus. At this time, a sputter power was set to be 1.0 [kw] and a time required for the formation of the film was set to be 3 minutes.

In other respects, the halftone type phase shift mask blank according to the seventh embodiment was obtained in the same manner as in the first embodiment and the same patterning as described above was carried out to obtain a halftone type phase shift mask according to the fourth embodiment.

[Eighth Embodiment]

As a variant of the fourth embodiment, there was manufactured a halftone type phase shift mask blank in which only the structure of a second shielding film 32 to be a reflectance adjusting section 3a is changed.

More specifically, in a halftone type phase shift mask blank according to a eighth embodiment, a second shielding film 32 (see FIG. 2(a)) comprising CrCON having a thickness of 167 [Å] was formed on a first shielding film 31 by reactive sputtering in a mixed gas atmosphere of an Ar gas to be an inactive gas and $N_2$ and $CO_2$ gases to be raw material gases (Ar flow rate=20 [sccm], $N_2$ flow rate=25 [sccm], $CO_2$ flow rate=8 [sccm]) using a chromium target in a stationary opposed type sputtering apparatus. At this time, a sputter power was set to be 1.0 [kw] and a time required for the formation of the film was set to be 7 minutes.

In other respects, the halftone type phase shift mask blank according to the eighth embodiment was obtained in the same manner as in the fourth embodiment and the same patterning as described above was carried out to obtain a halftone type phase shift mask according to the eighth embodiment.

Referring to the halftone type phase shift mask blanks according to the fourth to eighth embodiments described above, the following Table 3 collectively shows film forming conditions (a flow rate of each raw material gas, a sputter power and a film forming time), film species and a thickness of the second shielding film 32 to be the reflectance adjusting section 3a.

TABLE 3

| Embodiments | Species of Reflectance Adjusting Section | Gas Flow Rate [sccm] | | | Thickness [Å] | Power [kw] | Time [min] |
| --- | --- | --- | --- | --- | --- | --- | --- |
| | | Ar | N2 | CO2 | | | |
| 4 | CrCON | 20 | 17 | 17 | 161 | 1 | 7 |
| 5 | CrCON | 20 | 21 | 12 | 179 | 1 | 4.5 |
| 6 | CrCON | 20 | 23 | 10 | 163 | 1 | 3.5 |
| 7 | CrCON | 20 | 24 | 9 | 159 | 1 | 3 |
| 8 | CrCON | 20 | 25 | 8 | 157 | 1 | 3 |

In any of the embodiments, the first shielding film 31 to be the ground section 3b has a thickness of 400 [Å]. Accordingly, the thicknesses of the whole shielding films 3 in the halftone type phase shift mask blanks according to the first to fifth embodiments are 561 [Å], 579 [Å], 563 [Å], 559 [Å] and 567 [Å] respectively which are equal to or less than 600 [Å](=60 [nm])

[Result of Measurement of Optical Characteristic]

For each of the halftone type phase shift masks obtained in the fourth to eighth embodiments, a test light was irradiated to measure the reflectance and wavelength dependency of each of the transparent substrate 1, the semitranslucent film 2 and the shielding film 3. HITACHI spectrophotometer U-4000 was used for the measurement of the reflectance and wavelength dependency.

Figure 4:
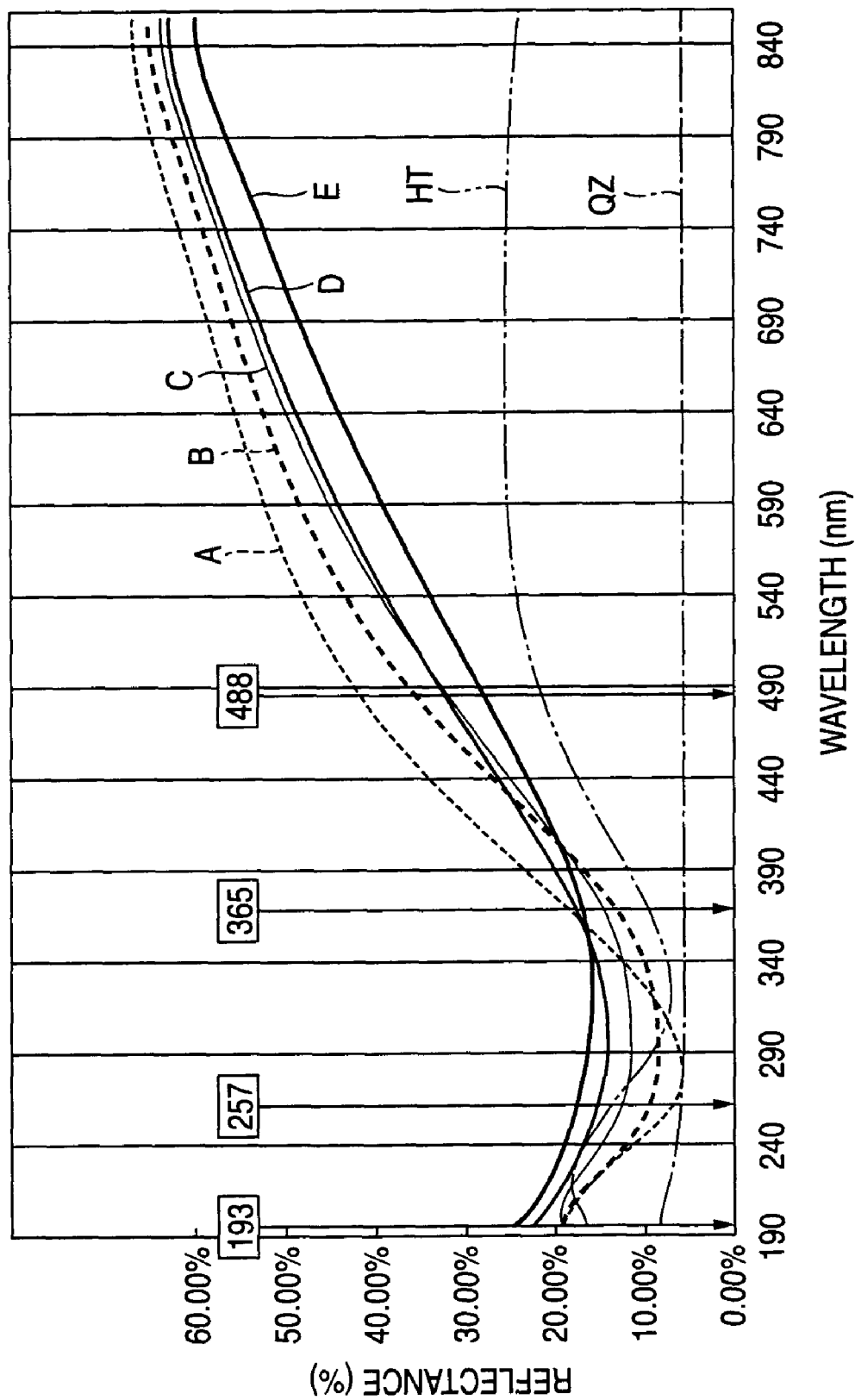
FIG. 4 is a chart showing the reflectance and wavelength dependency of a halftone type phase shift mask according to each of fourth to eighth embodiments.

The result of the measurement is shown in FIG. 4. FIG. 4 shows a reflectance curve, in which an axis of ordinate indicates a reflectance (%) and an axis of abscissa indicates a wavelength [nm] of a test light. More specifically, the reflectance curve is a graph representing the wavelength dependency of the reflectance. In FIG. 3, A, B, C, D and E indicate the reflectance curves of the surface of the shielding film 3 according to the first, second, third, fourth and fifth embodiments, respectively. HT indicates the reflectance curve of the semitranslucent film 2. QZ indicates the reflectance curve of the transparent substrate 1. The reflectance curves of the semitranslucent film 2 and the transparent substrate 1 are common to all of the fourth to eighth embodiments.

(1) As is apparent from FIG. 3, all of the reflectance curves A, B, C, D and E of the shielding film 3 are lines which are curved in a rightward and upward direction over 190 [nm] to 840 [nm] in such a manner that the reflectance in a region having a wavelength of 365 [nm] or more which mainly includes an inspection wavelength is greater than the reflectance in a region having a wavelength of less than 365 [nm] which mainly includes an exposure wavelength and a resist drawing wavelength.

The way of a rise in each reflectance curve becomes gentler in order of A (the fourth embodiment), B (the fifth embodiment), C (the sixth embodiment), D (the seventh embodiment) and E (the eighth embodiment). As a result of investigations in this respect, the flow rate of nitrogen in the sputtering formation of the reflectance adjusting section 3a is increased in order of the embodiments 4 to 8 as shown in the Table 3. When the flow rate of the nitrogen is increased, the partial pressure of the nitrogen in a sputtering atmosphere is raised correspondingly. Consequently, the content rate (amount) of the nitrogen in the reflectance adjusting section 3a is increased.

Consequently, the way of the rise in the reflectance curve of the shielding film 3 becomes gentler (broader) when the content rate of the nitrogen in the reflectance adjusting section 3a of the shielding film 3 is increased. To the contrary, it can be said that the way of the rise in the reflectance curve becomes steeper when the content rate of the nitrogen in the reflectance adjusting section 3a is more decreased.

In other words, the content of the nitrogen and the reflectance curve of the shielding film 3, that is, the reflectance and wavelength dependency of the shielding film 3 have a correlation. Accordingly, it is supposed that the reflectance and wavelength dependency of the shielding film 3 can be adjusted with the content rate of the nitrogen in the case in which the reflectance adjusting section 3a is formed of CrCON.

(2) Moreover, the reflectance and wavelength dependency, that is, the reflectance curve is not extremely changed for each embodiment but is gradually changed as shown in FIG. 4. In other words, a change in the reflectance curve is small when the content rate of the nitrogen is adjusted. The small change in the reflectance curve implies that the reflectance and wavelength dependency of the shielding film 3 can be finely adjusted delicately and accurately with the content rate of the nitrogen.

(3) In all of the reflectance curves A, B, C, D and E, furthermore, the reflectance is 30% or less, in detail, 25% or less from 193 [nm] which can be the exposure wavelength to 365 [nm] which can be the resist drawing wavelength. If each of the reflectances for an exposed light is 30% or less, the generation of a standing wave for the exposed light is prevented so that precision in a transfer pattern can be enhanced. Also in the case in which the halftone type phase shift mask is used as a reticle, moreover, a bad influence can be prevented from being exerted by the irregular reflection of a light in the exposure of a stepper. If each of the reflectances for a drawing laser beam to be irradiated on the photoresist 5 as well as an exposed light in the execution of a pattern transfer using the halftone type phase shift mask is 30% or less, furthermore, it is possible to enhance precision in the dimension of the halftone type phase shift mask itself.

In the halftone type phase shift masks according to the first to fifth embodiments, accordingly, it is possible to select the exposure wavelength and the resist drawing wavelength within a wavelength range of 193 [nm] to 365 [nm].

(4) Furthermore, in the case in which the content rate of the nitrogen in the reflectance adjusting section 3a is increased with the flow rate of the nitrogen set to be 23 [sccm] or more in the film formation of the reflectance adjusting section 3a, for example, the wavelength dependency of the reflectance within the wavelength range of 193 [nm] to 365 [nm], particularly, is reduced as in the reflectance curves C, D and E. In other words, the reflectance curve is almost flat from 193 [nm] to 365 [nm] so that a change in the reflectance is set to be 10% or less. Moreover, the change in the reflectance is set to be 25% or less from 193 [nm] to 488 [nm].

Accordingly, it can be supposed that the shielding film 3 does not need to be redesigned and changed even if the exposure wavelength or the resist drawing wavelength is varied within a wavelength range of 193 [nm] to 488 [nm], particularly, the wavelength range of 193 [nm] to 365 [nm].

(5) On the other hand, in the case in which the flow rate of the nitrogen in the film formation of the reflectance adjusting section 3a is set to be 23 [sccm] or less, for example, and the content rate of the nitrogen in the reflectance adjusting section 3a is reduced, a minimum value is once taken within a wavelength range of 257 [nm] to 365 [nm] as in the reflectance curves A and B. For this reason, an optimum exposure wavelength or resist drawing wavelength is present in the minimum value or the vicinity thereof.

For example, a minimum value having a reflectance of 10% or less is present in the vicinity of the wavelength of 257 [nm] in the reflectance curve A. In the halftone type phase shift mask blank according to the first embodiment, accordingly, a light having the wavelength of 257 [nm] can be suitably used as a drawing laser beam.

It is supposed that the wavelength for the minimum value can also be adjusted to have a desirable value depending on the content rate of the nitrogen in the reflectance adjusting section 3a.

(6) As shown in FIG. 4, moreover, all of a difference in the reflectance between the transparent substrate (QZ) and the semitranslucent film pattern (HT), a difference in a reflectance between the semitranslucent film pattern (HT) and the shielding film pattern (A, B, C, D, E) and a difference in a reflectance between the transparent substrate (QZ) and the shielding film pattern (A, B, C, D, E) are 3% or more in at least a region having the wavelength of 365 [nm] or more. According to the studies of the inventor, it is apparent that the difference between the reflectances can be recognized in an inspecting apparatus if the difference in the reflectance among the transparent substrate, the semitranslucent film pattern and the shielding film pattern is thus 3% or more. The difference between the reflectances is preferably 5% or more, and more preferably 10% or more.

More specifically, if the difference in the reflectance between the transparent substrate and the semitranslucent film pattern is 3% or more (preferably 5% or more and more preferably 10% or more), the semitranslucent film pattern can reliably be detected in the inspecting apparatus. Moreover, if the difference in the reflectance between the semitranslucent film pattern and the shielding film pattern is 3% or more (preferably 5% or more and more preferably 10% or more), the shielding film pattern can reliably be detected in the inspecting apparatus. As a result, the defect of the mask can reliably be detected in the inspecting apparatus.

Accordingly, at least the region having the wavelength of 365 [nm] or more can be set to be an inspection wavelength region. In at least the region having the wavelength of 365 [nm] or more, furthermore, the shielding film pattern has a higher reflectance than that of the semitranslucent film pattern. Consequently, the halftone type phase shift mask is particularly preferable for inspecting a defect such as residual chromium or a pinhole.

In particular, the reflectance curve E indicative of the broadest rise represents a difference in a reflectance of 3% or more in relation to the semitranslucent film pattern (HT) within a whole wavelength range of 190 [nm] to 840 [nm], and furthermore, consistently represents a higher reflectance than that of the semitranslucent film pattern (HT).

(7) As shown in FIG. 4, moreover, the reflectance is 40% or less within a wavelength range of 193 [nm] to 500 [nm] including the inspection wavelength in the reflectance curves B, C, D and E. Therefore, the halftone type phase shift mask blanks according to the second to fifth embodiments corresponding thereto can be inspected well in an inspecting apparatus having an upper limit of the reflectance of 40%. In particular, the reflectance is 30% or less within a range of 193 [nm] to 500 [nm] in the reflectance curve E. Accordingly, the halftone type phase shift mask blank according to the fifth embodiment can be inspected well in an inspecting apparatus having an upper limit of the reflectance of 30%.

COMPARATIVE EXAMPLE 1

As a comparative example 1, there was manufactured a halftone type phase shift mask blank in which only the structure of a second shielding film 32 to be a reflectance adjusting section 3a is changed.

More specifically, in a halftone type phase shift mask blank according to the comparative example 1, the second shielding film 32 (see FIG. 2a) comprising CrON (which implies that chromium, oxygen and nitrogen are contained and their content rates are not defined and so forth) was formed on a first shielding film 31 by reactive sputtering in a mixed gas atmosphere of Ar, $N_2$ and $O_2$ (Ar flow rate=20 [sccm], $N_2$ flow rate=10 [sccm], $O_2$ flow rate=20 [sccm]) using a chromium target in a stationary opposed type sputtering apparatus. At this time, a sputter power was set to be 1.0 [kw] and a time required for the formation of the film was set to be 3 minutes.

In other respects, the halftone type phase shift mask blank according to the comparative example 1 was obtained in the same manner as in the fourth embodiment and the same patterning as described above was carried out to obtain a halftone type phase shift mask according to the comparative example 1.

COMPARATIVE EXAMPLE 2

As a comparative example 2, there was manufactured a halftone type phase shift mask blank in which only the structure of a second shielding film 32 to be a reflectance adjusting section 3a is changed.

More specifically, in a halftone type phase shift mask blank according to the comparative example 2, the second shielding film 32 (see FIG. 2a) comprising CrON having a thickness of 452 [Å] was formed on a first shielding film 31 by reactive sputtering in a mixed gas atmosphere of Ar, $N_2$ and $O_2$ (Ar flow rate=20 [sccm], $N_2$ flow rate=15 [sccm], $O_2$ flow rate=15 [sccm]) using a chromium target in a stationary opposed type sputtering apparatus. At this time, a sputter power was set to be 1.0 [kw] and a time required for the formation of the film was set to be 3 minutes.

In other respects, the halftone type phase shift mask blank according to the comparative example 2 was obtained in the same manner as in the fourth embodiment and the same patterning as described above was carried out to obtain a halftone type phase shift mask according to the comparative example 2.

COMPARATIVE EXAMPLE 3

As a comparative example 3, there was manufactured a halftone type phase shift mask blank in which only the structure of a second shielding film 32 to be a reflectance adjusting section 3a is changed.

More specifically, in a halftone type phase shift mask blank according to the comparative example 3, the second shielding film 32 (see FIG. 2a) comprising CrON having a thickness of 473 [Å] was formed on a first shielding film 31 by reactive sputtering in a mixed gas atmosphere of Ar, $N_2$ and $O_2$ (Ar flow rate=20 [sccm], $N_2$ flow rate=25 [sccm], $O_2$ flow rate=25 [sccm]) using a chromium target in a stationary opposed type sputtering apparatus. At this time, a sputter power was set to be 1.0 [kw] and a time required for the formation of the film was set to be 3 minutes.

In other respects, the halftone type phase shift mask blank according to the comparative example 3 was obtained in the same manner as in the fourth embodiment and the same patterning as described above was carried out to obtain a halftone type phase shift mask according to the comparative example 3.

COMPARATIVE EXAMPLE 4

As a comparative example 4, there was manufactured a halftone type phase shift mask blank in which only the structure of a second shielding film 32 to be a reflectance adjusting section 3a is changed.

More specifically, in a halftone type phase shift mask blank according to the comparative example 4, the second shielding film 32 (see FIG. 2a) comprising CrON having a thickness of 611 [Å] was formed on a first shielding film 31 by reactive sputtering in a mixed gas atmosphere of Ar, $N_2$ and $O_2$ (Ar flow rate=20 [sccm], $N_2$ flow rate=25 [sccm], $O_2$ flow rate=8 [sccm]) using a chromium target in a stationary opposed type sputtering apparatus. At this time, a sputter power was set to be 1.0 [kw] and a time required for the formation of the film was set to be 3 minutes.

In other respects, the halftone type phase shift mask blank according to the comparative example 4 was obtained in the same manner as in the fourth embodiment and the same patterning as described above was carried out to obtain a halftone type phase shift mask according to the comparative example 4.

COMPARATIVE EXAMPLE 5

As a comparative example 5, there was manufactured a halftone type phase shift mask blank in which only the structure of a second shielding film 32 to be a reflectance adjusting section 3a is changed.

More specifically, in a halftone type phase shift mask blank according to the comparative example 5, the second shielding film 32 (see FIG. 2a) comprising CrON having a thickness of 604 [Å] was formed on a first shielding film 31 by reactive sputtering in a mixed gas atmosphere of Ar, $N_2$ and $O_2$ (Ar flow rate=20 [sccm], $N_2$ flow rate=23 [sccm], $O_2$ flow rate=10 [sccm]) using a chromium target in a stationary opposed type sputtering apparatus. At this time, a sputter power was set to be 1.0 [kw] and a time required for the formation of the film was set to be 3 minutes.

In other respects, the halftone type phase shift mask blank according to the comparative example 5 was obtained in the same manner as in the fourth embodiment and the same patterning as described above was carried out to obtain a halftone type phase shift mask according to the comparative example 5.

Referring to the halftone type phase shift mask blanks according to the comparative examples 1 to 5 described above, the following Table 4 shows film forming conditions, (a flow rate of each raw material gas, a sputter power and a film forming time), film species and a thickness of the second shielding film 32 to be the reflectance adjusting section 3a.

TABLE 2

| Embod-iments | Species of Reflectance Adjusting Section | Gas Flow Rate [sccm] | | | Thickness [Å] | Power [kw] | Time [min] |
|---|---|---|---|---|---|---|---|
| | | Ar | N2 | CO2 | | | |
| 1 | CrCON | 20 | 10 | 20 | — | 1 | 3 |
| 2 | CrCON | 20 | 15 | 15 | 452 | 1 | 3 |
| 3 | CrCON | 20 | 25 | 25 | 473 | 1 | 3 |
| 4 | CrCON | 20 | 25 | 8 | 611 | 1 | 3 |
| 5 | CrCON | 20 | 23 | 10 | 604 | 1 | 3 |

Result of Measurement of Optical Characteristic in Comparative Examples 1 to 5

Figure 5:
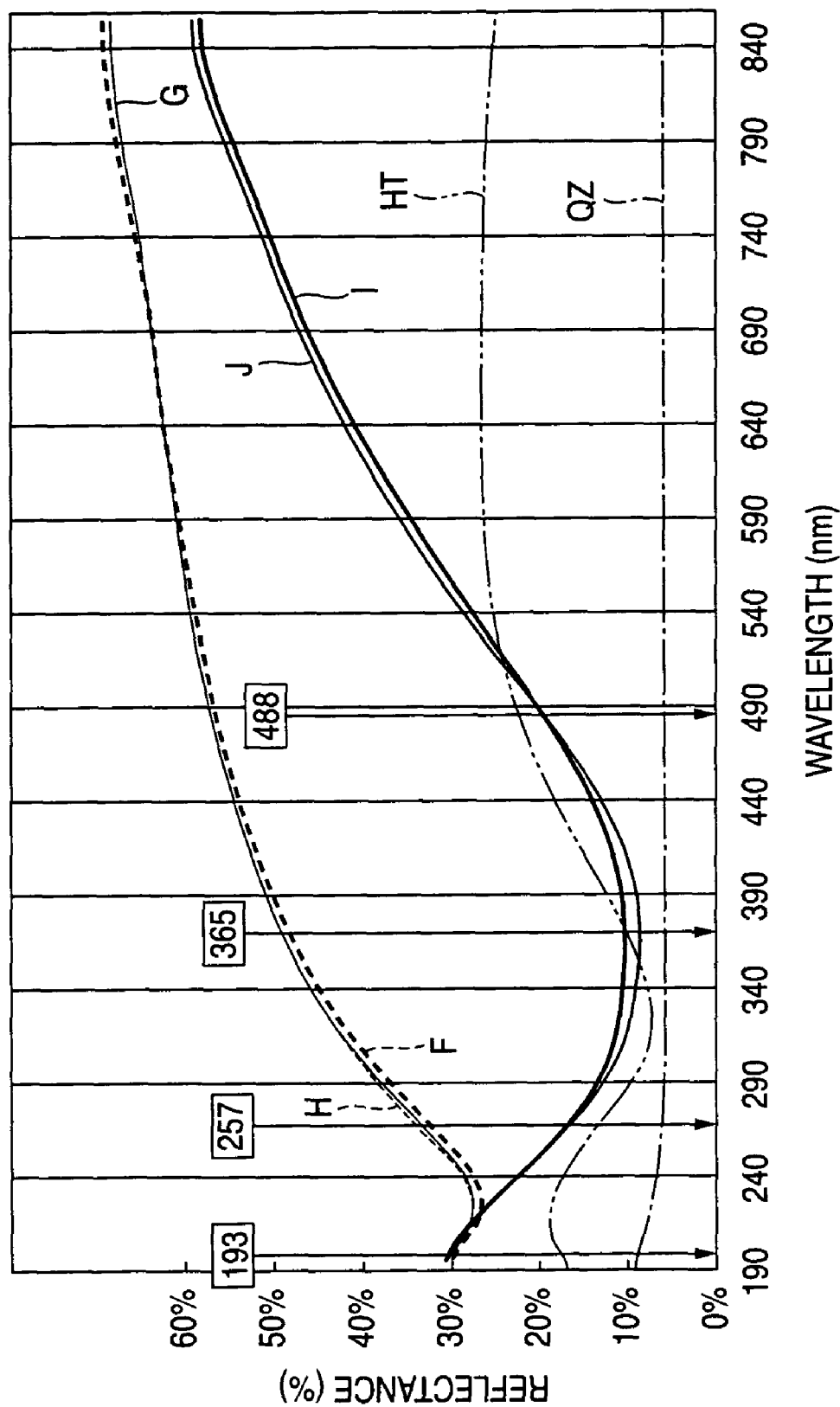
FIG. 5 is a chart showing the reflectance and wavelength dependency of a halftone type phase shift task according to each of comparative examples 1 to 5.

For each of the halftone type phase shift masks obtained in the comparative examples 1 to 5, the reflectance curves of the transparent substrate 1, the semitranslucent film 2 and the shielding film 3 were measured in the same manner as in each of the embodiments. The result of the measurement is shown in FIG. 5. In FIG. 4, F, G, H, I and J indicate the reflectance curves of the surface of the shielding film 3 according to the comparative examples 1, 2, 3, 4 and 5, respectively. HT indicates the reflectance curve of the semitranslucent film 2. QZ indicates the reflectance curve of the transparent substrate 1. The reflectance curves of the semitranslucent film 2 and the transparent substrate 1 are common to all of the fourth to eigth embodiments and the comparative examples 1 to 5.

(1) In the comparative examples 1 to 5, CrON is employed as the composition of the reflectance adjusting section 3a in place of CrCON and the content rate of the nitrogen in the reflectance adjusting section 3a is changed for each comparative example. In the case in which CrON is employed as the reflectance adjusting section 3a, thus, the way of the change in the reflectance curves F, G, H, I and J and the flow rate of a nitrogen gas (the content rate of nitrogen) do not have a definite correlation as shown in FIG. 5.

(2) In detail, as shown in FIG. 5, the reflectance curves F, G and H almost overlap each other and the reflectance curves I and J almost overlap each other. With reference to the Table 4, whether their boundary has a definite critical value of the flow rate of the nitrogen is not certain. In this case, it is supposed that the flow rate of oxygen and other film forming conditions are also concerned in the reflectance and wavelength dependency of the shielding film 3. In the case in which the reflectance adjusting section 3a is formed of CrON, accordingly, it is hard to say that the reflectance and wavelength dependency of the shielding film 3 can be controlled by only the flow rate of the nitrogen.

(3) Moreover, the ways of the changes in the reflectance curves F, G and H and the reflectance curves I and J are extremely different from each other. In the case in which oxygen is used in place of carbon dioxide in the sputtering film formation of the reflectance adjusting section 3a to form the reflectance adjusting section 3a comprising CrON, therefore, it is apparent that the reflecting spectrum (the reflectance and wavelength dependency) of the shielding film 3 is extremely changed with the content rate of each constitutional element. In other words, it is hard to say that the shielding film 3 according to each of the comparative examples 1 to 5 has the excellent controllability of the reflectance and wavelength dependency.

(4) The (2) and (3) prove such an effectiveness that the reflectance adjusting section 3a contains carbon as in the fourth to eigth embodiments. More specifically, when a sputtering atmosphere in the formation of the reflectance adjusting section 3a contains the carbon ($CO_2$ or CO) so that the reflectance adjusting section 3a is caused to contain the carbon, it is possible to enhance the controllability of the reflectance and wavelength dependency of the shielding film 3 by controlling the content rate of the nitrogen in the reflectance adjusting section 3a (the partial pressure of $N_2$ in the sputtering atmosphere).

[Ninth Embodiment]

As a variant of the first embodiment, there was manufactured a halftone type phase shift mask blank in which only the structures of a first shielding film 31 to be a ground section 3b and a second shielding film 32 to be a reflectance adjusting section 3a are changed.

More specifically, in a halftone type phase shift mask blank according to a sixth embodiment, the first shielding film 31 comprising CrON having a thickness of 400 [Å] was formed on a semitranslucent film 2 by reactive sputtering in a mixed gas atmosphere of an Ar gas to be an inactive gas and an $N_2$ gas to be a raw material gas (Ar flow rate=18.2 [sccm], $N_2$ flow rate=12.1 [sccm], gas pressure=0.074 [Pa]) using a chromium target in a stationary opposed type sputtering apparatus. At this time, a sputter power was set to be 2.00 [kw].

Next, the second shielding film 32 comprising CrCON having a thickness of 165 [Å] was formed on the first shielding film 31 by reactive sputtering in a mixed gas atmosphere of an Ar gas to be an inactive gas and $N_2$ and $CO_2$ gases to be raw material gases (Ar flow rate=20 [sccm], $N_2$ flow rate=38 [sccm], $CO_2$ flow rate=15.7 [sccm], gas pressure=0.175 [Pa]) using the chromium target in the stationary opposed type sputtering apparatus. At this time, a sputter power was set to be 1.30 [kw].

In other respects, the halftone type phase shift mask blank according to the sixth embodiment was obtained in the same manner as in the fourth embodiment and the same patterning as described above was carried out to obtain a halftone type phase shift mask according to the ninth embodiment.

The following Table 5 collectively shows film forming conditions (a flow rate of each raw material gas, a sputter power and a film forming pressure), film species and a thickness of the first shielding film 31 (the ground section) and the second shielding film 32 (the reflectance adjusting section) according to the ninth embodiment.

TABLE 5

| 9th Embodiment | Species of Reflectance Adjusting Section | Gas Flow Rate [sccm] | | | Thickness [Å] | Power [kw] | Time [min] |
|---|---|---|---|---|---|---|---|
| | | Ar | N2 | CO2 | | | |
| Ground | CrN | 18.2 | 12.1 | — | 400 | 2.00 | 0.074 |
| Adjusting Section | CrCON | 20 | 38 | 15.7 | 165 | 1.30 | 0.175 |

As shown in the Table 5, in the ninth embodiment, the thickness of the whole shielding film 3 is reduced to be 60 [nm] or less which is smaller than that in each of the fourth to eighth embodiments. More specifically, the thickness of the shielding film 3 according to the ninth embodiment is 400+165=565 [Å], that is, 56.5 [nm].

[Reflectance Curve]

Figure 6:
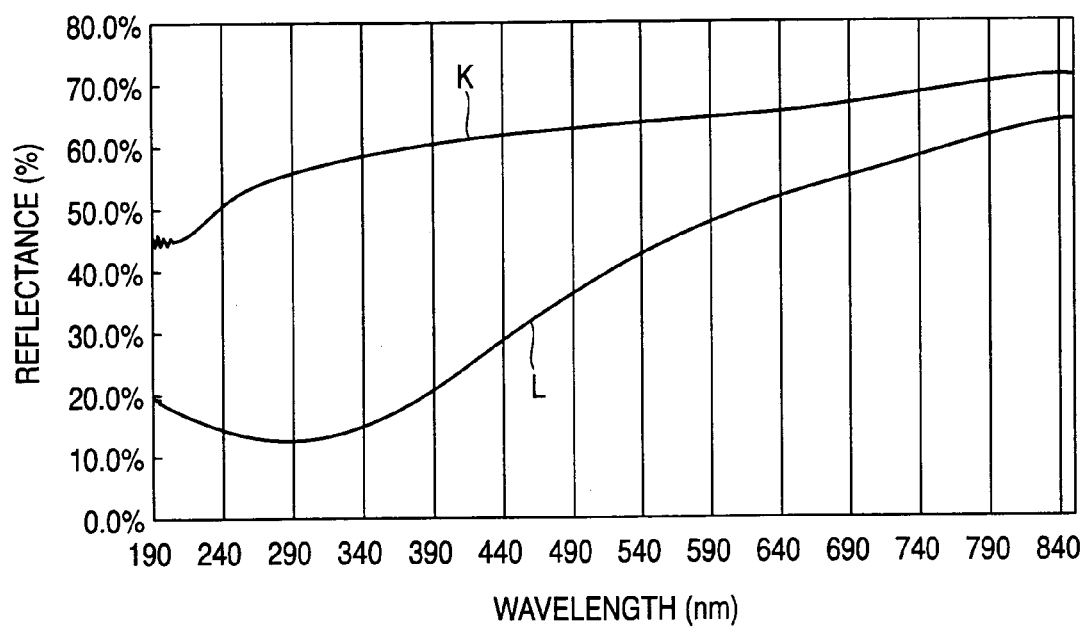
FIG. 6 is a chart showing the reflectance and wavelength dependency of a shielding film in a halftone type phase shift mask according to an ninth embodiment.

Referring to each halftone type phase shift mask according to the ninth embodiment, the reflectance curve of the shielding film 3 was measured in the same manner as in each of the embodiments. FIG. 6 shows the result of the measurement. In FIG. 5, K indicates the reflectance curve of the ground section 3*b* and L indicates the reflectance curve of a laminated film formed by the ground section 3*b* and the reflectance adjusting section 3*a*, that is, the whole shielding film 3.

As shown in FIG. 6, the reflectance curve L of the shielding film 3 according to the ninth embodiment has a smaller reflectance and wavelength dependency, that is, a change in the reflectance within a wavelength range of 193 [nm] to 365 [nm] is 10% or less. In addition, the reflectance is consistently 20% or less within such a wavelength range and the shielding film 3 has a very preferred reflectance and wavelength dependency.

[Auger Electron Spectral Analysis Result]

The compositions of the first shielding film 31 (the ground section) and the second shielding film 32 (the reflectance adjusting section) in the ninth embodiment were checked by an Auger electron spectral analyzer. The result is shown in the following Table 6.

TABLE 6

| Ninth Embodiment | Cr [atomic %] | O [atomic %] | N [atomic %] | C [atomic %] |
|---|---|---|---|---|
| Ground section | 80 | — | 20 | — |
| Reflectance adjusting section | 35 | 40 | 15 | 10 |

As shown in the Table 6, in the shielding film 3 according to the ninth embodiment, the ground section 3*b* does not contain oxygen and the reflectance adjusting section 3*a* contains at least 20 atomic % of oxygen. In detail, the reflectance adjusting section 3*a* contains 35 atomic % of chromium, 10 atomic % of carbon, 40 atomic % of oxygen and 15 atomic % of nitrogen.

[OD Curve]

Figure 7:
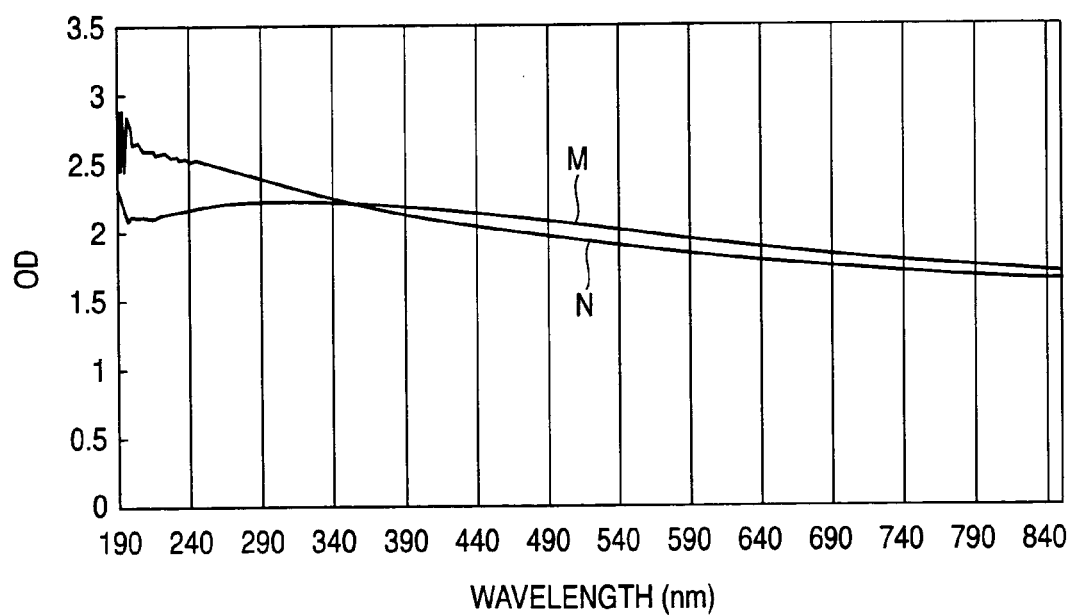
FIG. 7 is a chart showing the optical density and wavelength dependency of the shielding film in the halftone type phase shift mask according to the ninth embodiment.

Referring to each halftone type phase shift mask obtained in the ninth embodiment, the optical density of the shielding film 3 was measured. FIG. 7 shows the result of the measurement. In FIG. 7, an axis of ordinate indicates an optical density (OD) and an axis of abscissa indicates an OD curve taking a wavelength [nm] of a test light. More specifically, the OD curve is a graph representing the wavelength dependency of the optical density. In FIG. 6, M indicates the OD curve of the ground section 3*b* and N indicates the OD curve of a laminated film formed by the ground section 3*b* and the reflectance adjusting section 3*a*, that is, the whole shielding film 3.

Although the shielding film 3 according to the sixth embodiment is set to have a thickness of 60 [nm] or less, in detail, 56.5 [nm], the OD curve N indicates a sufficient optical density of 2 or more within a wavelength range of 193 [nm] to 365 [nm] as shown in FIG. 6. Therefore, it is possible to obtain an optical density of 3 or more when the shielding film 3 is formed together with a semitranslucent film.

It can be supposed that the shielding film 3 is constituted to include the ground section 3*b* which does not contain oxygen. In other words, it can be supposed that a total film thickness is essentially increased if the whole shielding film 3 is constituted by only CrCON. In the case in which the shielding film 3 is constituted by using the ground section 3*b* from which oxygen is excluded, the ground section 3*b* exhibits a high shielding property. Also in the case in which CrCON is employed as the reflectance adjusting section 3*a*, therefore, the total thickness of the shielding film 3 can be reduced to be 60 [nm] or less.

In the case in which CrCON is employed as the reflectance adjusting section 3*a*, a thickness thereof is set to be 165 [Å] and a thickness of the whole shielding film 3 is set to be 60 [nm] or less, the shielding film 3 shows a particularly excellent reflectance and wavelength dependency as shown in FIG. 6. Moreover, it is also possible to obtain a synergy effect that processing precision can be enhanced when the shielding film 3 is subjected to patterning if the thickness of the shielding film 3 is thus reduced.

While the embodiments of the invention have been described above, the invention is not restricted thereto.

For example, in the halftone type phase shift mask blank according to the invention, the shielding film 3 may be formed by using an inline type sputtering apparatus in place of the stationary opposed type sputtering apparatus using a batch method or a sheet method. In that case, the shielding film 3 is constituted in such a manner that the component is continuously changed in the direction of a thickness thereof.

Moreover, the halftone type phase shift mask may be constituted in such a manner that the reflectance of a semitranslucent film pattern is higher than that of a shielding film pattern for an inspecting light.

Furthermore, the materials of the shielding film pattern and the semitranslucent film pattern are not particularly restricted to the embodiments.

The semitranslucent film 2 can be constituted by a single layer substantially comprising metal, silicon, nitrogen and/or oxygen or a laminated layer thereof.

Moreover, the semitranslucent film 2 may be constituted by a multilayer structure having a high transmittance layer and a low transmittance layer. In this case, the high transmittance layer can substantially comprise silicon and nitrogen, and/or oxygen or can contain a very small amount of metal such as chromium, molybdenum, tantalum, tungsten, zirconium or hafnium in addition thereto. Furthermore, the low transmittance layer can be constituted by at least one material selected from magnesium, aluminum, titanium, vanadium, chromium, yttrium, zirconium, niobium, molybdenum, tin, lanthanum, tantalum, tungsten, silicon and hafnium.

According to the invention, the defects or foreign substances of the halftone type phase shift mask can be detected more reliably. According to the invention, moreover, the halftone type phase shift mask can be inspected strictly and easily by using an inspecting apparatus. As a result, the halftone type phase shift mask can be provided more stably with a great yield.

Furthermore, the reflectance and wavelength dependency of the shielding film in the halftone type phase shift mask can be adjusted easily and accurately. Accordingly, it is possible to properly and rapidly redesign the halftone type phase shift mask with a change in an exposure wavelength, a resist drawing wavelength and an inspection wavelength.

What is claimed is:

1. A halftone type phase shift mask comprising, on a transparent substrate, a semitranslucent film pattern having a predetermined transmittance and phase shift amount for an exposed light and a shielding film pattern formed on the semitranslucent film pattern,
    wherein each of reflectances of the transparent substrate, the semitranslucent film pattern and the shielding film pattern for an inspecting light are sufficiently different that the semitranslucent film pattern and the shielding film pattern can be detected based on a reflected light generated when the inspecting light is irradiated on the mask, and
    wherein the exposed light has a wavelength of 200 nanometers or less.

2. The halftone type phase shift mask according to claim 1, wherein the shielding film pattern is formed on the semitranslucent film pattern in a transfer region.

3. The halftone type phase shift mask according to claim 1, wherein the semitranslucent film pattern is constituted to have a transmittance of 8 to 80%.

4. The halftone type phase shift mask blank according to claim 3, wherein reflectances of the transparent substrate, the semitranslucent film and the shielding film for an inspecting light are different from each other by 3% or more.

5. The halftone type phase shift mask according to claim 1, wherein the most surface side of the shielding film pattern contains chromium and oxygen.

6. A halftone type phase shift mask manufactured by using the halftone type phase shift mask blank according to claim 3 or 5.

7. A halftone type phase shift mask blank to be used as a material for manufacturing the halftone type phase shift mask according to claim 1.

8. A method of adjusting a reflectance and wavelength dependency of a shielding film in a halftone type phase shift mask blank comprising, on a transparent substrate, a semitranslucent film having a predetermined transmittance and phase shift amount for an exposed light and the shielding film formed on the semitranslucent film,
    wherein an uppermost layer portion of the shielding film is set to be a reflectance adjusting section containing chromium, carbon, oxygen and nitrogen, and
    the reflectance and wavelength dependency of the whole shielding film is adjusted based on a content rate of the nitrogen in the reflectance adjusting section.

9. The method of adjusting a reflectance and wavelength dependency of a shielding film in a halftone type phase shift mask according to claim 8, wherein said reflectance and wavelength dependency is adjusted to have a reflectance of a surface of the shielding film not more than 30% for a wavelength of an exposed light ranging from 193 nm to 365 nm.

10. The method of adjusting a reflectance and wavelength dependency of a shielding film in a halftone type phase shift mask according to claim 8, wherein said reflectance and wavelength dependency is adjusted to have a reflectance difference between the translucent film and the shielding film to be no more than 3%.

11. A method of manufacturing a halftone type phase shift mask blank comprising a semitranslucent film forming step of forming, on a transparent substrate, a semitranslucent film having a predetermined transmittance and phase shift amount for an exposed light and a shielding film forming step of forming a shielding film on the semi-translucent film,
    wherein the shielding film forming step includes a reflectance adjusting section forming step of carrying out sputtering film formation using a target made of chromium in an atmosphere containing carbon, oxygen and nitrogen, thereby forming a reflectance adjusting section in a portion to be an uppermost layer of the shielding film, and
    a partial pressure of the nitrogen in the atmosphere is set to have such a value that the shielding film has a reflectance and wavelength dependency at the reflectance adjusting section forming step, wherein said reflectance and wavelength dependency is adjusted to have a reflectance of a surface of the shielding film not more than 30% for a wavelength of an exposed light ranging from 193 nm to 365 nm.

12. The method of manufacturing a halftone type phase shift mask blank according to claim 11, wherein the atmosphere containing the carbon, the oxygen and the nitrogen is an atmosphere containing carbon dioxide and nitrogen.

13. A halftone type phase shift mask blank comprising, on a transparent substrate, a semitranslucent film having a predetermined transmittance and phase shift amount for an exposed light and a shielding film formed on the semitranslucent film,
    wherein an uppermost layer portion of the shielding film is set to be a reflectance adjusting section containing chromium, carbon, oxygen and nitrogen, and
    a reflectance of a surface of the shielding film is 30% or less for a wavelength of an exposed light ranging from 193 nm to 365 nm.

14. A halftone type phase shift mask blank according to claim 13, wherein a change in the reflectance for said wavelength of the exposed light ranging from 193 nm to 365 nm is set to be 10% or less.

15. A halftone type phase shift mask blank comprising, on a transparent sub-strate, a semitranslucent film having a predetermined transmittance and phase shift amount for an exposed light and a shielding film containing chromium formed on the semitranslucent film,
    wherein an uppermost layer portion of the shielding film is set to be a reflectance adjusting section containing chromium, carbon, oxygen and nitrogen, and
    a thickness of the whole shielding film including the reflectance adjusting section is set to be 60 nanometers or less.

16. A halftone type phase shift mask blank according to claim 15, wherein said wavelength of the exposed light is no more than 200 nm.

17. A halftone type phase shift mask blank according to claim 15, wherein the shielding film pattern has a ground section on the semitranslucent film pattern side and a reflectance adjusting section on the ground section,
wherein the ground section does not contain the oxygen or the content rate of the oxygen is set to be 10 atomic % or less.

18. A halftone type phase shift mask blank according to claim 15, wherein the semitranslucent film pattern is constituted to have a transmittance of 8 to 30%.

19. A halftone type phase shift mask blank according to claim 15, wherein said halftone type phase shift mask blank is used as a material for manufacturing a halftone type phase shift mask.

20. A halftone type phase shift mask blank according to claim 15, wherein said halftone type phase shift mask blank is used as a material for manufacturing a halftone type phase shift mask, said halftone type phase shift mask having a shielding film pattern, which is formed on a semitranslucent film pattern on a transparent substrate.

21. A halftone type phase shift mask blank according to claim 15, wherein said halftone type phase shift mask blank is used as material for manufacturing a halftone type phase shift mask, said halftone type phase shift mask having a shielding film pattern, which is formed on a semitranslucent film pattern in a transfer region.

22. A halftone type phase shift mask blank comprising, on a transparent sub-strate, a semitranslucent film having a predetermined transmittance and phase shift amount for an exposed light and a shielding film containing chromium formed on the semitranslucent film,
wherein the shielding film has a ground section on the semitranslucent film side and a reflectance adjusting section on the ground section,
the reflectance adjusting section contains chromium, carbon, oxygen and nitrogen and a content rate of the oxygen is set to be 20 atomic % or more, and
the ground section does not contain the oxygen or the content rate of the oxygen is 10 atomic % or less.

23. A halftone type phase shift mask blank comprising, on a transparent sub-strate, a semitranslucent film having a predetermined transmittance and phase shift amount for an exposed light and a shielding film containing chromium formed on the semitranslucent film,
wherein the shielding film has a ground section on the semitranslucent film side and a reflectance adjusting section on the ground section,
the reflectance adjusting section contains 20 to 50 atomic % of chromium, 5 to 20 atomic % of carbon, 20 to 50 atomic % of oxygen and 5 to 40 atomic % of nitrogen, and
the ground section does not contain the oxygen or a content rate of the oxygen is set to be 10 atomic % or less.

24. A halftone type phase shift mask blank comprising, on a transparent sub-strate, a semitranslucent film having a predetermined transmittance and phase shift amount for an exposed light and a shielding film containing chromium formed on the semitranslucent film,
wherein the shielding film has a ground section on the semitranslucent film side and a reflectance adjusting section on the ground section,
the reflectance adjusting section contains 20 to 50 atomic % of chromium, 5 to 20 atomic % of carbon, 20 to 50 atomic % of oxygen and 5 to 40 atomic % of nitrogen, and
the ground section does not contain the oxygen.

25. A halftone type phase shift mask blank comprising, on a transparent sub-strate, a semitranslucent film having a predetermined transmittance and phase shift amount for an exposed light and a shielding film containing chromium formed on the semitranslucent film,
wherein the shielding film has a ground section on the semitranslucent film side and a reflectance adjusting section on the ground section,
the reflectance adjusting section contains chromium, carbon, oxygen and nitrogen and a content rate of the oxygen is set to be 20 atomic % or more, and
a thickness of the whole shielding film including the reflectance adjusting section is set to be 60 nanometers or less.

26. A halftone type phase shift mask blank comprising, on a transparent sub-strate, a semitranslucent film having a predetermined transmittance and phase shift amount for an exposed light and a shielding film containing chromium formed on the semitranslucent film,
wherein the shielding film has a ground section on the semitranslucent film side and a reflectance adjusting section on the ground section,
the reflectance adjusting section contains 20 to 50 atomic % of chromium, 5 to 20 atomic % of carbon, 20 to 50 atomic % of oxygen and 5 to 40 atomic % of nitrogen, and
a thickness of the whole shielding film including the reflectance adjusting section is set to be 60 nanometers or less.

27. A halftone type phase shift mask blank comprising, on a transparent sub-strate, a semitranslucent film having a predetermined transmittance and phase shift amount for an exposed light and a shielding film containing chromium formed on the semitranslucent film,
wherein the shielding film has a ground section on the semitranslucent film side and a reflectance adjusting section on the ground section,
the reflectance adjusting section contains chromium, carbon, oxygen and nitrogen and a content rate of the oxygen is set to be 20 atomic % or more,
the ground section does not contain the oxygen or a content rate of the oxygen is set to be 10 atomic % or less, and
a thickness of the whole shielding film is set to be 60 nanometers or less.

28. A halftone type phase shift mask comprising, on a transparent substrate, a semitranslucent film pattern having a predetermined transmittance and phase shift amount for an exposed light and a shielding film pattern formed on the semitranslucent film pattern,
wherein an uppermost layer portion of the shielding film pattern is set to be a reflectance adjusting section containing chromium, carbon, oxygen and nitrogen, and
a thickness of the whole shielding film pattern including the reflectance adjusting section is set to be 60 nanometers or less.

29. A halftone type phase shift mask comprising, on a transparent substrate, a semitranslucent film pattern having a predetermined transmittance and phase shift amount for an exposed light and a shielding film pattern formed on the semitranslucent film pattern,
wherein the shielding film pattern has a ground section on the semitranslucent film pattern side and a reflectance adjusting section on the ground section, the reflectance adjusting section contains chromium, carbon, oxygen and nitrogen and a content rate of the oxygen is set to be 20 atomic % or more, and the ground section does not contain the oxygen or the content rate of the oxygen is set to be 10 atomic % or less.

30. A halftone type phase shift mask comprising, on a transparent substrate, a semitranslucent film pattern having a predetermined transmittance and phase shift amount for an exposed light and a shielding film pattern formed on the semitranslucent film pattern, wherein the shielding film pattern is formed in at least a pattern transfer region of the halftone type phase shift mask, an uppermost layer portion of the shielding film pattern is set to be a reflectance adjusting section containing chromium, carbon, oxygen and nitrogen, and a thickness of the whole shielding film pattern including the reflectance adjusting section is set to be 60 nanometers or less.

31. A halftone type phase shift mask comprising, on a transparent substrate, a semitranslucent film pattern having a predetermined transmittance and phase shift amount for an exposed light and a shielding film pattern formed on the semitranslucent film pattern, wherein the shielding film pattern is formed in at least a pattern transfer region of the halftone type phase shift mask, the shielding film pattern has a ground section on the semitranslucent film pattern side and a reflectance adjusting section on the ground section, the reflectance adjusting section contains chromium, carbon, oxygen and nitrogen and a content rate of the oxygen is set to be 20 atomic % or more, and the ground section does not contain the oxygen or the content rate of the oxygen is set to be 10 atomic % or less.

32. A halftone type phase shift mask blank comprising, on a transparent substrate, a semitranslucent film having a predetermined transmittance and phase shift amount for an exposed light and a shielding film formed on the semitranslucent film, wherein an uppermost layer portion of the shielding film is set to be a reflectance adjusting section containing chromium, carbon, oxygen and nitrogen, and a change in the reflectance for said wavelength of the exposed light ranging from 193 nm to 365 nm is set to be 10% or less.

33. A halftone type phase shift mask blank according to claim 13 or claim 32, wherein said wavelength of the exposed light is no more than 200 nm.

34. A method of manufacturing a halftone type phase shift mask blank comprising a semitranslucent film forming step of forming, on a transparent substrate, a semi-translucent film having a predetermined transmittance and phase shift amount for an exposed light and a shielding film forming step of forming a shielding film on the semitranslucent film, wherein the shielding film forming step includes a reflectance adjusting section forming step of carrying out sputtering film formation using a target made of chromium in an atmosphere containing carbon, oxygen and nitrogen, thereby forming a reflectance adjusting section in a portion to be an uppermost layer of the shielding film, and a partial pressure of the nitrogen in the atmosphere is set to have such a value that the shielding film has a reflectance and wavelength dependency at the reflectance adjusting section forming step, wherein said reflectance and wavelength dependency is a reflectance difference between the translucent film and the shielding film to be no more than 3%.

* * * * *